United States Patent
Shimoichi

(10) Patent No.: US 12,165,797 B2
(45) Date of Patent: Dec. 10, 2024

(54) CHIP INDUCTOR

(71) Applicant: ROHM Co., LTD., Kyoto (JP)

(72) Inventor: Takuma Shimoichi, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 1192 days.

(21) Appl. No.: 16/369,049

(22) Filed: Mar. 29, 2019

(65) Prior Publication Data

US 2019/0304663 A1    Oct. 3, 2019

(30) Foreign Application Priority Data

Mar. 30, 2018    (JP) .................................. 2018-068114

(51) Int. Cl.
*H01F 27/28*    (2006.01)

(52) U.S. Cl.
CPC .............................. *H01F 27/2804* (2013.01)

(58) Field of Classification Search
CPC ............. H01F 17/0013; H01F 27/2804; H01F 2027/2809; H01F 17/0006; H01F 5/003; H01F 27/29; H01F 27/292; H01F 27/327
USPC .................................................. 336/200, 232
See application file for complete search history.

(56) References Cited

U.S. PATENT DOCUMENTS

| | | | | |
|---|---|---|---|---|
| 2006/0091534 A1* | 5/2006 | Ohba | ..................... | H01F 41/041 257/723 |
| 2016/0012957 A1* | 1/2016 | Lim | ..................... | H01F 17/0013 336/200 |
| 2018/0316331 A1* | 11/2018 | Nakaiso | ................ | H01F 41/041 |
| 2019/0074127 A1* | 3/2019 | Ito | ............................. | H05K 3/24 |
| 2019/0096558 A1* | 3/2019 | Ito | ............................. | B06B 1/04 |

FOREIGN PATENT DOCUMENTS

| | | | |
|---|---|---|---|
| JP | 08-115840 A | 5/1996 | |
| JP | 2006-324462 | 11/2006 | |
| JP | 2007-103444 | 4/2007 | |
| JP | 2007103444 A * | 4/2007 | |
| JP | 2008227228 A * | 9/2008 | |
| JP | 2015201606 A * | 11/2015 | |
| JP | 2018-046051 | 3/2018 | |
| JP | 2018046257 | 3/2018 | |
| KR | 2014137306 A * | 12/2014 | |
| WO | WO-2016181953 A1 * | 11/2016 | ......... H01F 17/0013 |
| WO | WO-2016199516 A1 * | 12/2016 | ......... H01F 17/0013 |

OTHER PUBLICATIONS

Notification of Refusal cited in Japanese Application No. 2018-068114, mailed Jul. 5, 2022.
Notice of Reasons for Refusal cited in Japanese Application No. 2022-152157, mailed Sep. 28, 2023.

* cited by examiner

*Primary Examiner* — Tszfung J Chan
(74) *Attorney, Agent, or Firm* — CHIP LAW GROUP

(57) ABSTRACT

The present technology provides a chip inductor of which the height can be reduced. The chip inductor includes a sealing resin having a mounting face; a coil conductor disposed in the sealing resin, including an inner end and an outer end, and spirally wound; an inner terminal disposed on the mounting face, and electrically connected to the inner end; and an outer terminal disposed on the mounting face and electrically connected to the outer end.

19 Claims, 34 Drawing Sheets

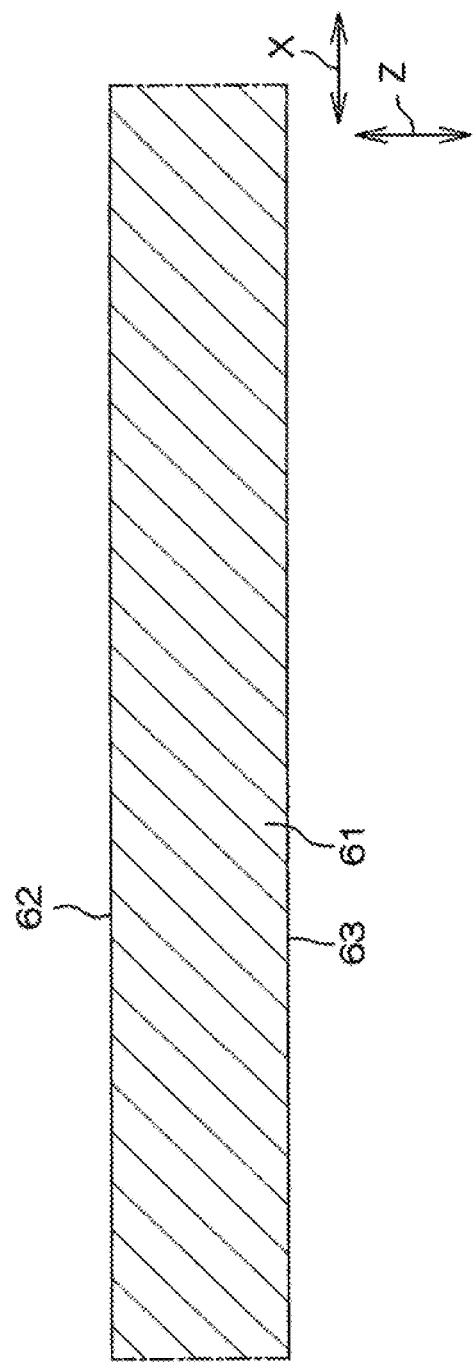

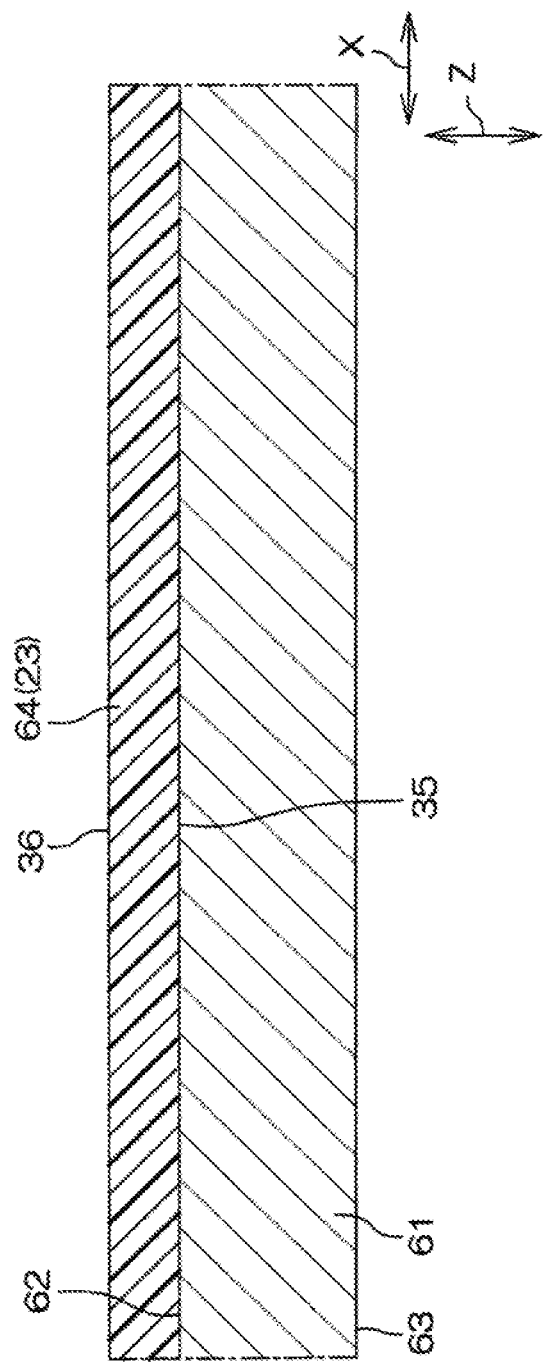

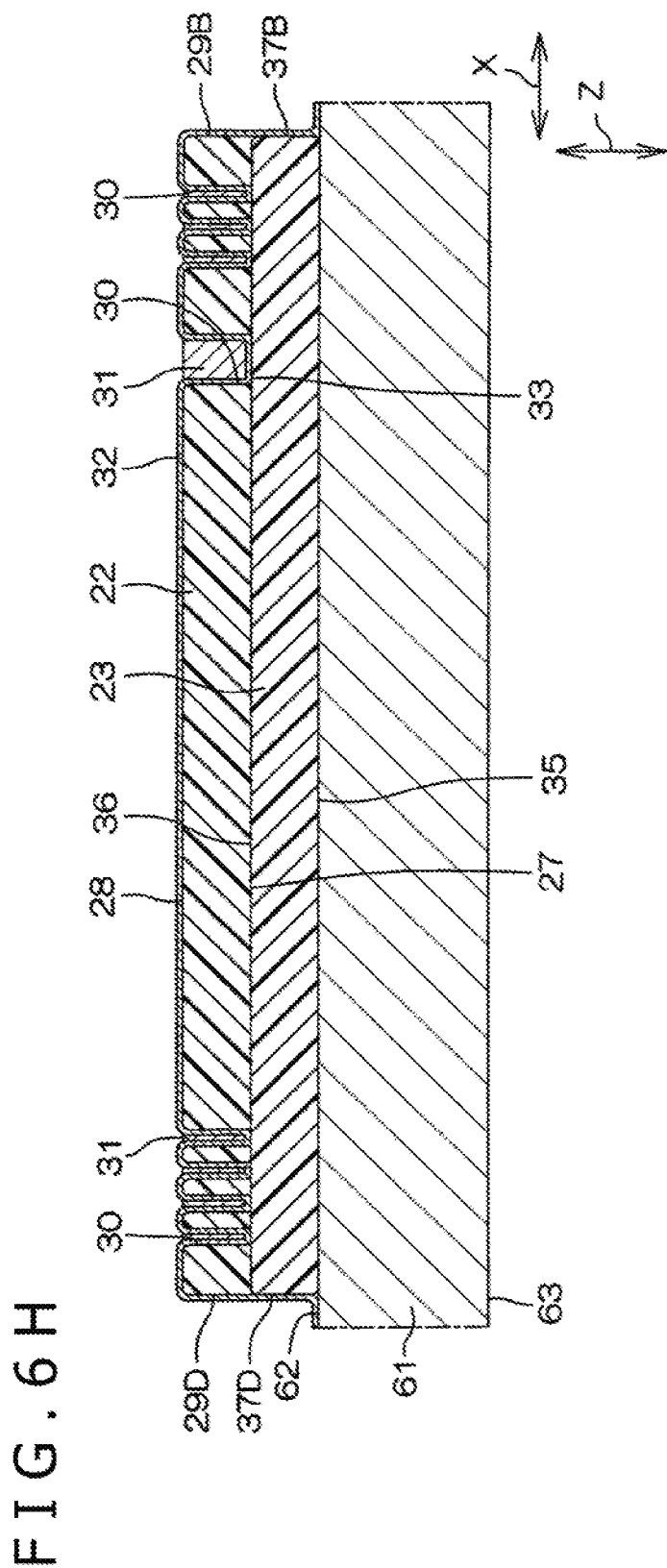

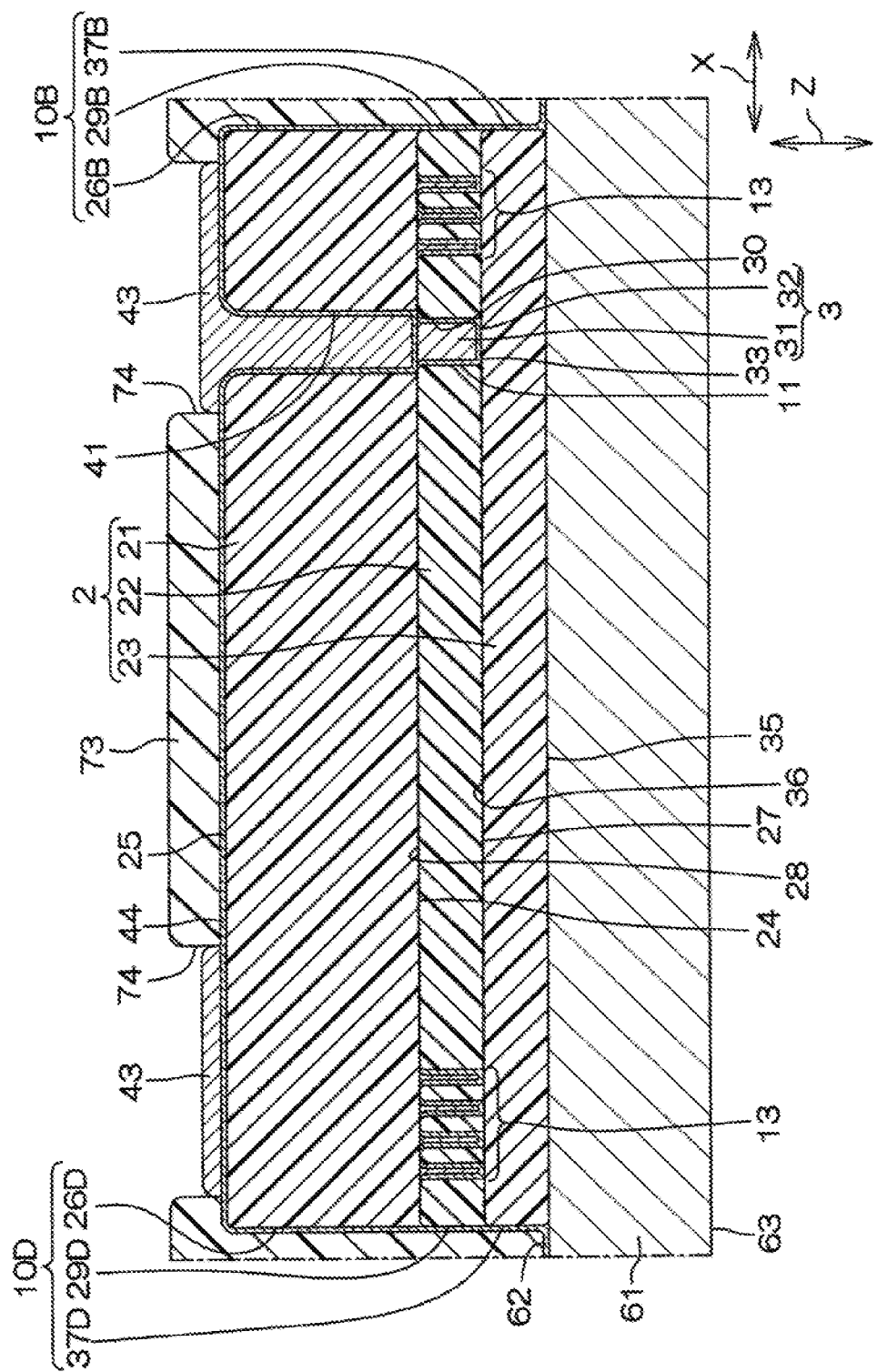

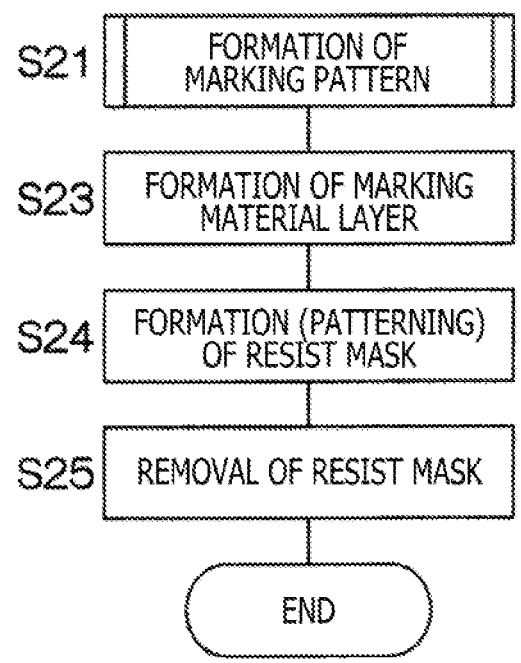

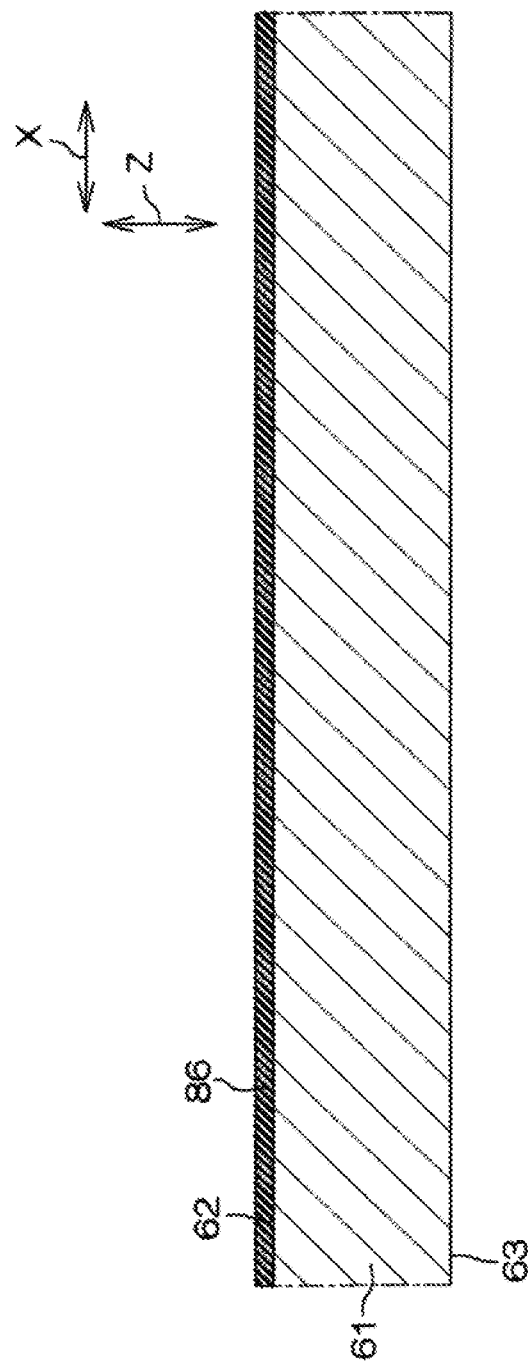

CHIP INDUCTOR

CROSS REFERENCE TO RELATED APPLICATIONS

This US. application claims priority benefit of Japanese Patent Application No. 2018-068114 filed in the Japan Patent Office on Mar. 30, 2018. Each of the above-referenced applications is hereby incorporated herein by reference in its entirety.

BACKGROUND

The present technology relates to a chip inductor.

Japanese Patent Laid-Open No. Hei 8-115840 discloses a chip inductor. This chip inductor includes a substrate made of an inorganic material containing silicon oxide, ceramic or glass. An inductor conductor layer is formed on a main face of the substrate made of an inorganic material.

One end of the inductor conductor layer is electrically connected to a first electrode layer. In addition, the other end of the inductor conductor layer is electrically connected to a second electrode layer. A resin layer covering the inductor conductor layer is formed on the substrate made of the inorganic material.

SUMMARY

The substrate made of an inorganic material is cut out from e.g. a flat or disk-shaped base substrate. The base substrate may also be referred to as a wafer. From the viewpoint of suppressing deflection and warp due to the self weight, the base substrate has a predetermined thickness.

The number of the chip inductors obtainable from one base substrate can be increased by making the base substrate large sized. However, in this case, the thickness of the base substrate should be increased as the base substrate becomes larger, and there is concern about heightening of the chip inductor.

On the other hand, depending on manufacturing methods, the resin layer covering the inductor conductor layer can be formed thinner than the base substrate while maintaining a certain strength. That is, in the chip inductor, a ratio of the substrate made of the inorganic material is higher than that of the resin layer. For this reason, height reduction of the chip inductor is hindered by the substrate made of the inorganic material.

Thus, an object of an embodiment of the present technology is to provide a chip inductor of which the height can be reduced.

An embodiment of the present technology provides a chip inductor including a sealing resin having a mounting face, a coil conductor disposed in the sealing resin, including an inner end and an outer end, and spirally wound, an inner terminal disposed on the mounting face, and electrically connected to the inner end, and an outer terminal disposed on the mounting face and electrically connected to the outer end.

This chip inductor can eliminate necessity for the substrate made of the inorganic material, providing a chip inductor of which the height can be reduced.

An embodiment of the present technology provides a chip inductor including a resin layer having a first face on one side and a second face on an other side, the second face being a mounting face, a coil conductor including an inner end and an outer end, and spirally wound on the first face of the resin layer, an inner terminal disposed on the second face, and electrically connected to the inner end, and an outer terminal disposed on the second face, and electrically connected to the outer end.

This chip inductor can eliminate necessity for the substrate made of the inorganic material, providing a chip inductor of which the height can be reduced.

An embodiment of the present technology provides a chip inductor including a sealing resin having a mounting face and made of a photosensitive resin, a coil conductor sealed with the sealing resin so as to be in contact with the sealing resin, including an inner end and an outer end, and spirally wound, an inner terminal disposed on the mounting face, and electrically connected to the inner end, and an outer terminal disposed on the mounting face, and electrically connected to the outer end.

This chip inductor can eliminate necessity for the substrate made of the inorganic material, providing a chip inductor of which the height can be reduced.

BRIEF DESCRIPTION OF THE DRAWINGS

FIG. 6A is a sectional view for explaining an example of a method for manufacturing the chip inductor depicted in FIG. 1;

FIG. 6B is a sectional view illustrating a step after the step of FIG. 6A;

FIG. 6H is a sectional view illustrating a step after the step of FIG. 6G;

FIG. 6M is a sectional view illustrating a step after the step of FIG. 6L;

FIG. 6O is a sectional view illustrating a step after the step of FIG. 6N;

FIG. 10 is a flowchart for explaining a step of Step S21 depicted in FIG. 9;

FIG. 11A is a sectional view for explaining an example of the method for manufacturing the chip inductor depicted in FIG. 7;

DETAILED DESCRIPTION OF THE PREFERRED EMBODIMENTS

Hereinafter, embodiments of the present technology will be described in detail with reference to accompanying drawings.

Figure 1:
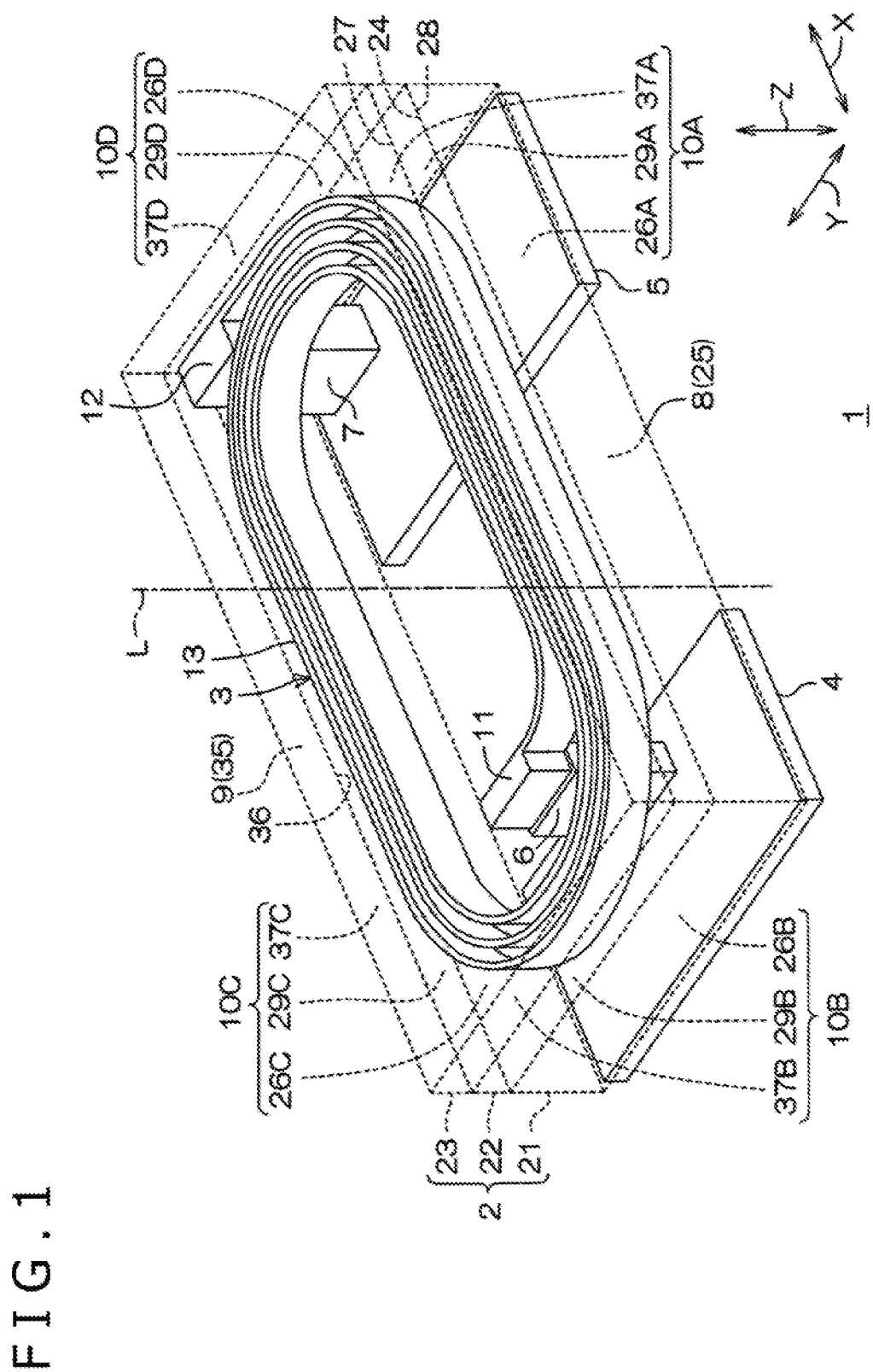
FIG. 1 is a perspective view of a chip inductor according to a first embodiment of the present technology, illustrated by seeing through a sealing resin.
Figure 2:
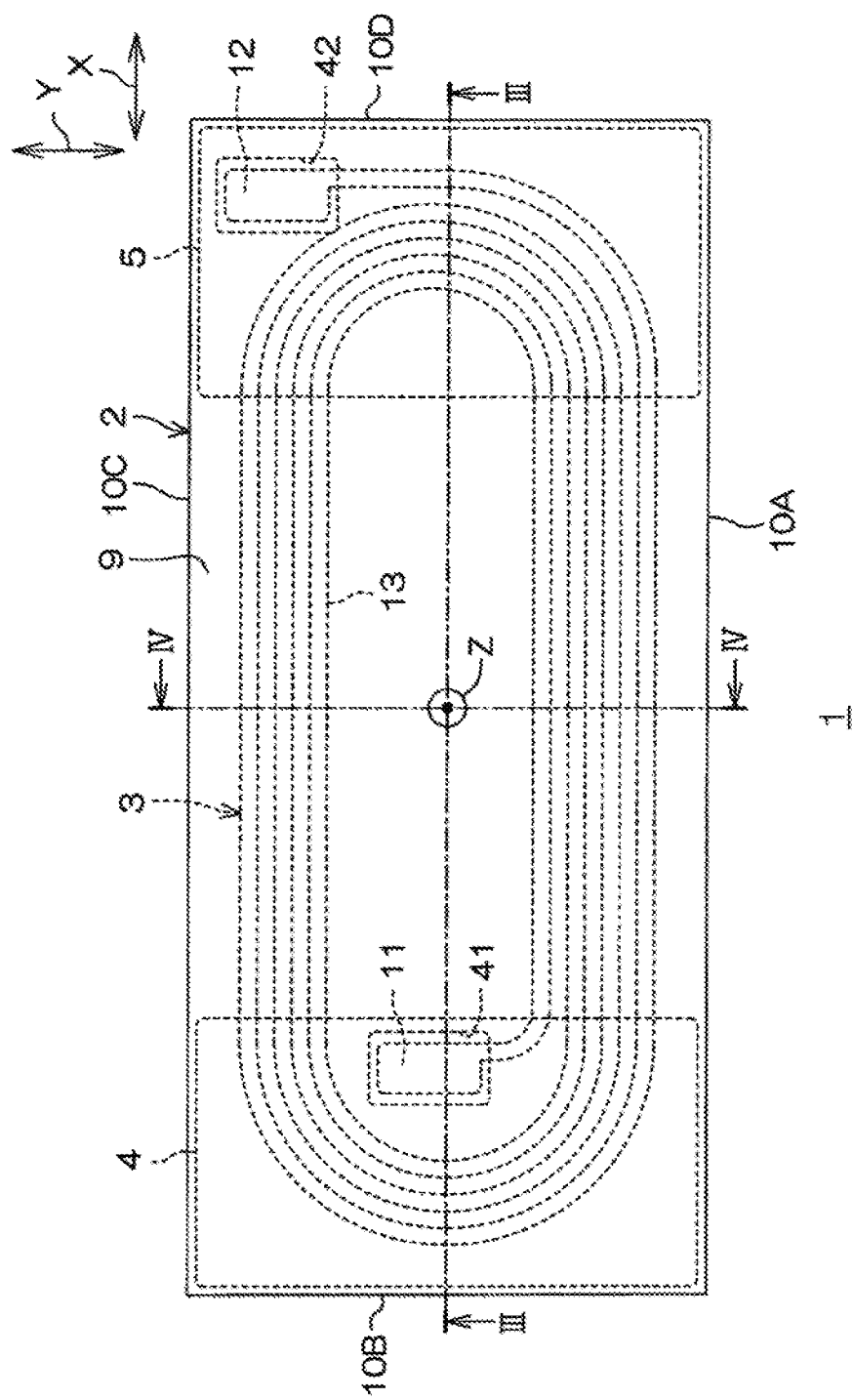
FIG. 2 is a top view of the chip inductor depicted in FIG. 1.

FIG. 1 is a perspective view of a chip inductor 1 according to a first embodiment of the present technology, illustrated by seeing through a sealing resin 2. FIG. 2 is a top view of the chip inductor 1 depicted in FIG. 1.

The chip inductor 1 is a small chip part having a one side length of several millimeters (e.g. 1 mm or shorter) referred to as a 0603 (0.6 mm×0.3 mm) chip, a 0402 (0.4 mm×0.2 mm) chip, a 03015 (0.3 mm×0.15 mm) chip, or the like.

Referring to FIGS. 1 and 2, the chip inductor 1 is a chip part including no substrate made of an inorganic material. The chip inductor 1 includes the sealing resin 2, a coil conductor 3, an inner terminal 4, an outer terminal 5, an inner contact electrode 6, and an outer contact electrode 7.

The sealing resin 2 is formed in a shape of a rectangular parallelepiped chip. The sealing resin 2 contains a photosensitive resin. The photosensitive resin may be of a negative type. More specifically, the sealing resin 2 contains an epoxy resin as the photosensitive resin. The sealing resin 2 has a mounting face 8, a non-mounting face 9, and four side faces 10A, 10B, 10C, and 10D configured to connect the mounting face 8 with the non-mounting face 9.

The mounting face 8 and the non-mounting face 9 are formed in a rectangular shape in a planar view as viewed from a normal direction Z of the faces (hereinafter simply referred to as "planar view"). The mounting face 8 is a face which is opposite to an attachment object when the chip inductor 1 is mounted on the attachment object such as a mounting substrate. The non-mounting face 9 is a face which is not opposite to the attachment object.

Among the four side faces 10A to 10D, the side faces 10A and 10C extend along a first direction X, and they are opposite to each other along a second direction Y crossing the first direction X. Among the four side faces 10A to 10D, the side faces 10B and 10D extend along the second direction Y, and they are opposite to each other along the first direction X.

In this configuration, the first direction X is set as a longitudinal direction of the sealing resin 2. In this configuration, the second direction Y is set as a direction orthogonal to the first direction X, i.e. as a shorter side direction of the sealing resin 2.

The chip sizes of the "0603," "0402," "03015," and the like described hereinbefore are defined depending on the length of the side faces 10A and 10C of the sealing resin 2, and the length of the side faces 10B and 10D of the sealing resin 2.

The sealing resin 2 may have a thickness of 30 to 250 µm. Preferably, the sealing resin 2 may have a thickness of 30 to 120 µm (e.g. approximately 100 µm). The thickness of the sealing resin 2 can be within a range of 30 to 250 µm (a range of 30 to 120 µm) regardless of the chip size.

The coil conductor 3 is not supported by the substrate made of the inorganic material. The coil conductor 3 is directly sealed by the sealing resin 2. The outer face of the coil conductor 3 is in contact with the sealing resin 2 and covered with the sealing resin 2. More specifically, the outer face of the coil conductor 3 is in contact with the sealing resin 2 except for portions in contact with the inner contact electrode 6 and the outer contact electrode 7.

The coil conductor 3 is spirally wound in the sealing resin 2. The coil conductor 3 has a winding axis line L extending along the normal direction Z, and is wound around the winding axis line L. As a result, the coil conductor 3 is spirally wound on a plane parallel to the mounting face 8 (non-mounting face 9). The coil conductor 3 may have a thickness of 10 to 50 µm (e.g. approximately 20 µm).

The distance between the mounting face 8 and the coil conductor 3 is preferably set to a value sufficient to reduce a parasitic capacitance generated between the mounting face 8 and the coil conductor 3. The distance between the mounting face 8 and the coil conductor 3 may be equal to or longer than the distance between the non-mounting face 9 and the coil conductor 3.

The distance between the mounting face 8 and the coil conductor 3 may be 10 to 100 µm (e.g. approximately 50 µm). The distance between the non-mounting face 9 and the coil conductor 3 may be 10 to 50 µm (e.g. approximately 20 µm).

The coil conductor 3 includes an inner end 11, an outer end 12, and a spiral portion 13 spirally wound between the inner end 11 and the outer end 12.

The inner end 11 is disposed at an end portion on one side along the first direction X in the sealing resin 2. More specifically, the inner end 11 is disposed at the end portion on the side face 10B in the sealing resin 2.

The inner end 11 is disposed on a middle portion in the second direction Y at the end portion on the side face 10B. The inner end 11 is formed in a square shape in a planar view. More specifically, the inner end 11 is formed in a rectangular shape extending along the second direction Y in the planar view.

The outer end 12 is disposed at an end portion on the other side along the first direction X in the sealing resin 2. More specifically, the outer end 12 is disposed at an end portion on the side face 10D in the sealing resin 2. The outer end 12 is disposed along one corner in the sealing resin 2.

More specifically, the outer end 12 is disposed along a corner connecting the side face 10C with the side face 10D. The outer end 12 may be disposed on a middle portion in the second direction Y at the end portion on the side face 10D. The outer end 12 is formed in a square shape in a planar view. More specifically, the outer end 12 is formed in a rectangular shape extending along the second direction Y in the planar view.

The spiral portion 13 is spirally wound around the winding axis line L. The spiral portion 13 is wound outward from the inner end 11 to the outer end 12. The number of turns of the spiral portion 13 is set to any value depending on a desired inductance value. In this configuration, the number of turns of the spiral portion 13 is "3."

In this configuration, the spiral portion 13 is wound in an elliptical shape. The form of the spiral portion 13 is not limited to the elliptical shape. The spiral portion 13 may be wound in a square shape, a rectangular shape, a polygonal shape, or a circular shape. The spiral portion 13 may have an aspect ratio of 1 or larger. The aspect ratio of the spiral portion 13 is defined depending on a ratio of a thickness of the spiral portion 13 to a width of the spiral portion 13.

The spiral portion 13 has a width equal to or smaller than the width of the inner end 11. The width of the spiral portion 13 is equal to or smaller than the width of the outer end 12. The inner end 11 may have a width of 10 to 50 μm (e.g. approximately 20 μm). The outer end 12 may have a width of 10 to 50 μm (e.g. approximately 20 μm). The spiral portion 13 may have a width of 10 to 150 μm (e.g. approximately 50 μm).

The inner terminal 4 is disposed on the non-mounting face 9. The inner terminal 4 is disposed at an end portion on one side along the first direction X in the non-mounting face 9. More specifically, the inner terminal 4 is disposed at the end portion on the side face 10B in the non-mounting face 9.

The inner terminal 4 is opposite to the inner end 11 of the coil conductor 3 through a part of the sealing resin 2 interposed therebetween. The inner terminal 4 may have a planar area equal to or larger than a planar area of the inner end 11. The inner terminal 4 is formed in a square shape in a planar view.

More specifically, the inner terminal 4 is formed in a rectangular shape extending along the second direction Y in the planar view. The inner terminal 4 may have a thickness of 1 to 20 μm (e.g. approximately 10 μm).

The outer terminal 5 is disposed on the non-mounting face 9. The outer terminal 5 is disposed at an end portion on the other side along the first direction X in the non-mounting face 9. More specifically, the outer terminal 5 is disposed at the end portion on the side face 10D in the non-mounting face 9.

The outer terminal 5 is opposite to the outer end 12 of the coil conductor 3 through a part of the sealing resin 2 interposed therebetween. The outer terminal 5 may have a planar area equal to or larger than a planar area of the outer end 12. The outer terminal 5 is formed in a square shape in planar view.

More specifically, the outer terminal 5 is formed in a rectangular shape extending along the second direction Y in planar view. The outer terminal 5 may have a thickness of 1 to 20 μm (e.g. approximately 10 μm).

The inner contact electrode 6 is directly sealed by the sealing resin 2. The outer face of the inner contact electrode 6 is in contact with the sealing resin 2 and covered with the sealing resin 2. The inner contact electrode 6 is interposed between the inner end 11 and the inner terminal 4, and electrically connects the inner end 11 with the inner terminal 4. The inner contact electrode 6 is formed in a columnar shape extending along the normal direction Z.

The outer contact electrode 7 is directly sealed by the sealing resin 2. The outer face of the outer contact electrode 7 is in contact with the sealing resin 2 and covered with the sealing resin 2. The outer contact electrode 7 is interposed between the outer end 12 and the outer terminal 5, and electrically connects the outer end 12 with the outer terminal 5. The outer contact electrode 7 is formed in a columnar shape extending along the normal direction Z.

Figure 3:
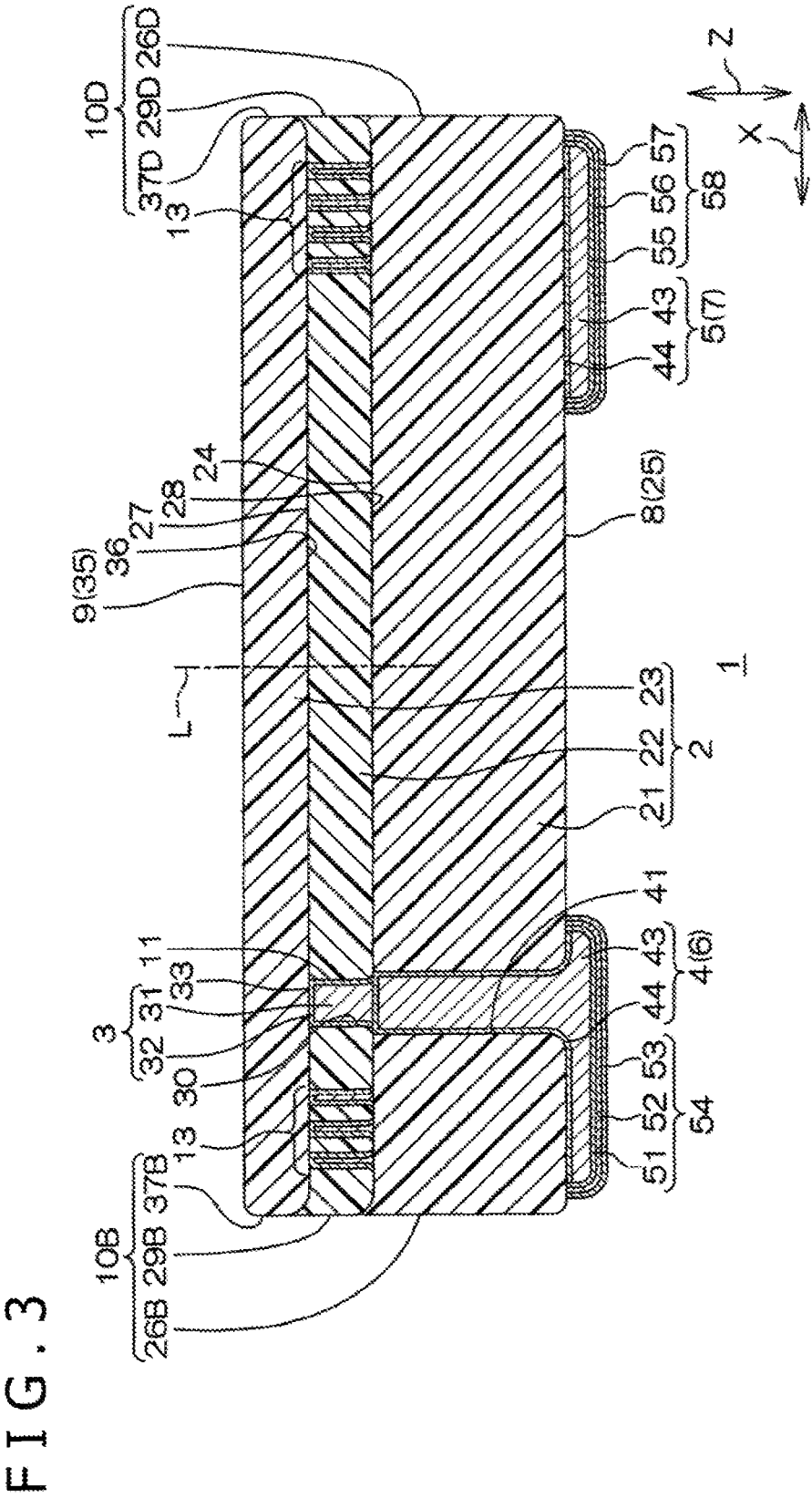
FIG. 3 is a sectional view taken along a line III-III depicted in FIG. 2.
Figure 4:
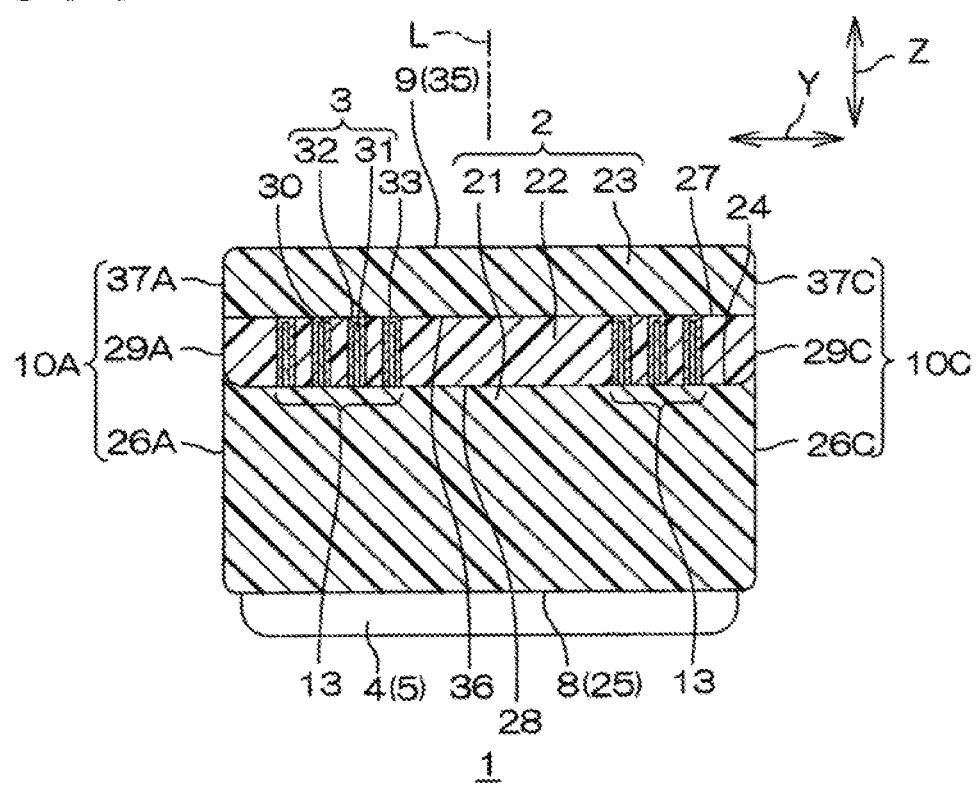
FIG. 4 is a sectional view taken along a line IV-IV depicted in FIG. 2.

FIG. 3 is a sectional view taken along the line III-III depicted in FIG. 2. FIG. 4 is a sectional view taken along the line IV-IV depicted in FIG. 2.

Referring to FIGS. 3 and 4, in this configuration, the sealing resin 2 has a resin laminated structure including a plurality of resin layers laminated along the normal direction Z of the mounting face 8. More specifically, the resin laminated structure has a three-layer structure including a supporting resin layer 21 (resin layer), a resin wiring layer 22, and a resin protective layer 23 in this order from the side of the mounting face 8.

The supporting resin layer 21, the resin wiring layer 22, and the resin protective layer 23 each contain a photosensitive resin (epoxy resin). All the supporting resin layer 21, the resin wiring layer 22, and the resin protective layer 23 may be made of a photosensitive resin (epoxy resin). That is, the sealing resin 2 may be made of a negative type photosensitive resin (epoxy resin).

The supporting resin layer 21 supports the coil conductor 3, the inner terminal 4, and the outer terminal 5, and demarcates the distance between the non-mounting face 9 and the coil conductor 3. The supporting resin layer 21 is formed in a film shape. The supporting resin layer 21 has a first face 24 on one side, a second face 25 on the other side, and four side faces 26A, 26B, 26C, and 26D connecting the first face 24 with the second face 25.

Each of the first face 24 and the second face 25 of the supporting resin layer 21 has a flat face extending parallel to the mounting face 8. The second face 25 of the supporting resin layer 21 constitutes the mounting face 8 of the sealing resin 2. The side faces 26A to 26D of the supporting resin layer 21 constitutes a part of the side faces 10A to 10D of the sealing resin 2.

The edge portion on the side of the second face 25 of the supporting resin layer 21 may have a curved portion which is curved in an outward-protruding shape. The edge portions of the supporting resin layer 21 are corners connecting the second face 25 with the side faces 26A to 26D. The supporting resin layer 21 may have a thickness of 10 to 100 μm (e.g. approximately 50 μm).

The resin wiring layer 22 is formed on the first face 24 of the supporting resin layer 21. The resin wiring layer 22 is formed in a film shape. In the resin wiring layer 22, the coil conductor 3 is embedded. The resin wiring layer 22 demarcates the shape and the thickness of the coil conductor 3.

The resin wiring layer 22 has a first face 27 on one side, a second face 28 on the other side, and four side faces 29A, 29B, 29C, and 29D connecting the first face 27 with the second face 28. Each of the first face 27 and the second face 28 of the resin wiring layer 22 has a flat face extending parallel to the mounting face 8. The second face 28 of the resin wiring layer 22 is integrated with the first face 24 of the supporting resin layer 21.

The side faces 29A to 29D of the resin wiring layer 22 are formed so as to be flush with the side faces 26A to 26D of the supporting resin layer 21. The side faces 29A to 29D of the resin wiring layer 22 constitute a part of the side faces 10A to 10D of the sealing resin 2.

The edge portion on the side of the second face 28 of the resin wiring layer 22 may have a curved portion which is curved in an outward-protruding shape. The edge portions of the resin wiring layer 22 are corners connecting the second face 28 with the side faces 29A to 29D. The edge portion of the resin wiring layer 22 is covered with the supporting resin layer 21. The resin wiring layer 22 may have a thickness of 10 to 50 μm (e.g. approximately 20 μm).

The resin wiring layer 22 has a coil trench 30. The coil trench 30 has a planar shape matching the planar shape of the coil conductor 3. The coil trench 30 penetrates the resin wiring layer 22 to expose the supporting resin layer 21.

The coil conductor 3 is embedded in the coil trench 30. In this configuration, the coil conductor 3 has a laminated structure including a main electrode layer 31 and a barrier electrode layer 32. The main electrode layer 31 contains Cu and constitutes the main body of the coil conductor 3.

The barrier electrode layer 32 is interposed between the main electrode layer 31 and the resin wiring layer 22 and prevent the electrode material of the main electrode layer 31 from diffusing into the resin wiring layer 22. The barrier electrode layer 32 has a thickness smaller than the thickness of the main electrode layer 31. The barrier electrode layer 32 may contain at least one of Ti and TiN.

The barrier electrode layer 32 has a covering portion 33 which covers the end portion on the side of the first face 27 of the resin wiring layer 22 in the main electrode layer 31. The covering portion 33 of the barrier electrode layer 32 is formed so as to be flush with the first face 27 of the resin wiring layer 22.

The resin protective layer 23 is formed on the first face 27 of the resin wiring layer 22 and covers the coil conductor 3. The resin protective layer 23 is formed in a film shape. The resin protective layer 23 protects the coil conductor 3, and demarcates the distance between the non-mounting face 9 of the sealing resin 2 and the coil conductor 3.

The resin protective layer 23 has a first face 35 on one side, a second face 36 on the other side, and side faces 37A, 37B, 37C, and 37D connecting the first face 35 with the second face 36. Each of the first face 35 and the second face 36 of the resin protective layer 23 has a flat face extending parallel to the mounting face 8.

The first face 35 of the resin protective layer 23 constitutes the non-mounting face 9 of the sealing resin 2. The second face 36 of the resin protective layer 23 is integrated with the first face 24 of the resin wiring layer 22. The side faces 37A to 37D of the resin protective layer 23 are formed so as to be flush with the side faces 26A to 26D of the resin wiring layer 22. The side faces 37A to 37D of the resin protective layer 23 constitute a part of the side faces 10A to 10D of the sealing resin 2.

The edge portion on the side of the first face 35 of the resin protective layer 23 may have a curved portion which is curved in an outward-protruding shape. The edge portions on the side of the first face 35 of the resin protective layer 23 are corners connecting the first face 35 with the side faces 37A to 37D.

The edge portion on the side of the second face 36 of the resin protective layer 23 may have a curved portion which is curved in an outward-protruding shape. The edge portions on the side of the second face 36 of the resin protective layer 23 are corners connecting the second face 36 with the side faces 37A to 37D. The edge portion on the side of the second face 36 of the resin protective layer 23 is covered with the resin wiring layer 22. The resin protective layer 23 may have a thickness of 10 to 50 μm (e.g. approximately 20 μm).

The supporting resin layer 21 has an inner contact hole 41 and an outer contact hole 42 (also see FIG. 2). The inner contact hole 41 penetrates the supporting resin layer 21 to expose the inner end 11 of the coil conductor 3. In this configuration, the inner contact hole 41 exposes the entire area of the inner end 11 in a planar view.

The outer contact hole 42 penetrates the supporting resin layer 21 to expose the outer end 12 of the coil conductor 3. In this configuration, the outer contact hole 42 exposes the entire area of the outer end 12 in a planar view.

The inner terminal 4 is inserted into the inner contact hole 41 from the mounting face 8. The inner terminal 4 is electrically connected to the inner end 11 of the coil conductor 3 in the inner contact hole 41. In this configuration, the inner contact electrode 6 is formed of a portion located in the inner contact hole 41 in the inner terminal 4.

The outer terminal 5 is inserted into the outer contact hole 42 from the mounting face 8. The outer terminal 5 is electrically connected to the outer end 12 of the coil conductor 3 in the outer contact hole 42. In this configuration, the outer contact electrode 7 is formed of a portion located in the outer contact hole 42 in the outer terminal 5.

In this configuration, the inner terminal 4 has a laminated structure including a main electrode layer 43 and a barrier electrode layer 44. The main electrode layer 43 contains Cu and constitutes the main body of the inner terminal 4.

The barrier electrode layer 44 is interposed between the main electrode layer 43 and the supporting resin layer 21 and prevents the electrode material of the main electrode layer 43 from diffusing into the supporting resin layer 21. The barrier electrode layer 44 is also interposed between the main electrode layer 43 and the coil conductor 3. The barrier electrode layer 44 has a thickness smaller than the thickness of the main electrode layer 43. The barrier electrode layer 44 may contain at least one of Ti and TiN.

The outer terminal 5 has the structure similar to that of the inner terminal 4. For the description of the outer terminal 5, the description of the inner terminal 4 is correspondingly applied. With respect to the structures of the outer terminal 5 corresponding to the structures of the inner terminal 4, the explanation is omitted by providing the same reference symbols as described for the inner terminal 4.

In this configuration, the outer face of the inner terminal 4 is covered with an Ni/Pd/Au laminated structure 54 including the an Ni layer 51, a Pd layer 52, and an Au layer 53 laminated in this order from the side of the inner terminal 4.

In this configuration, the outer face of the outer terminal 5 is covered with an Ni/Pd/Au laminated structure 58 including an Ni layer 55, a Pd layer 56 and an Au layer 57 laminated in this order from the side of the outer terminal 5.

As described hereinbefore, the chip inductor 1 can eliminate necessity for the substrate made of the inorganic material, providing the chip inductor 1 of which the height can be reduced.

In addition, the chip inductor 1 allows the sealing resin 2 to have only the coil conductor 3, the inner contact electrode 6, and the outer contact electrode 7 as structures other than the resin. Consequently, the height reduction and miniaturization can be effectively achieved for the chip inductor 1.

Furthermore, the chip inductor 1 allows the sealing resin 2 to have a resin laminated structure including the plurality of resin layers 21, 22, and 23. Each thickness of the plurality of resin layers 21, 22, and 23 is 100 μm or less. Thus, an ultrathin chip inductor 1 can be provided.

For example, the chip inductor 1 allows the thickness of the sealing resin 2 to be within a range of 30 to 250 μm (a range of 30 to 120 μm) regardless of the chip size.

In addition, the chip inductor 1 includes the resin protective layer 23 covering the coil conductor 3. Thus, the coil conductor 3 can be adequately protected.

In addition, the chip inductor 1 allows the distance between the mounting face 8 and the coil conductor 3 to be set to a value sufficient to reduce the parasitic capacitance that can be generated between the mounting face 8 and the coil conductor 3. More specifically, the distance between the mounting face 8 and the coil conductor 3 is set to be equal to or longer than the distance between the non-mounting face 9 and the coil conductor 3.

Thus, the parasitic capacitance between the coil conductor 3 and the inner terminal 4, and the parasitic capacitance between the coil conductor 3 and the outer terminal 5 can be reduced. Consequently, the noises can be reduced while achieving the height reduction.

In addition, generation of an overcurrent resulting from a magnetism generated by the coil conductor 3 in the inner terminal 4 and the outer terminal 5 can be suppressed. Consequently, also from this viewpoint, the noises can be reduced while achieving the height reduction.

Figure 5:
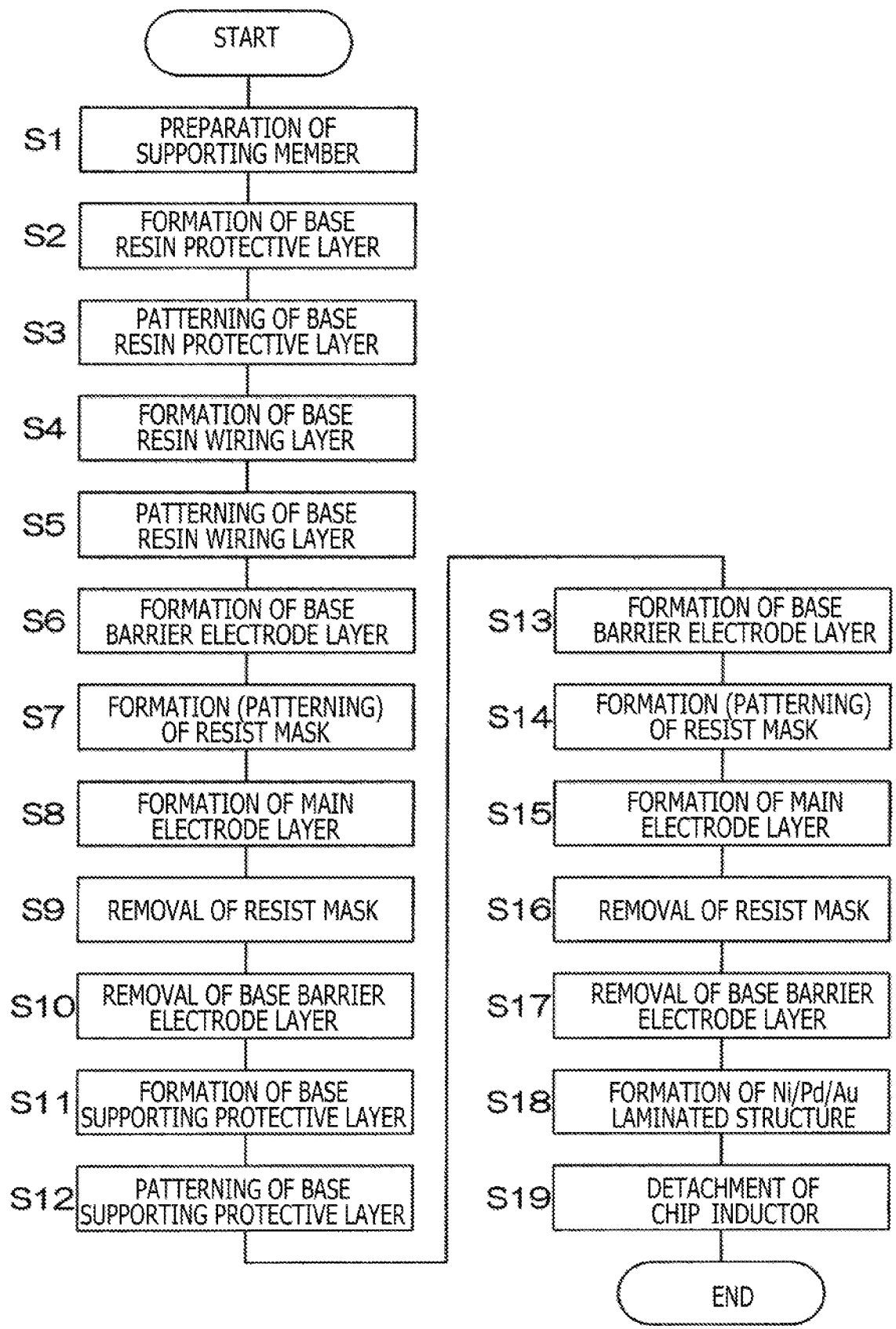
FIG. 5 is a flowchart for explaining an example of a method for manufacturing the chip inductor depicted in FIG. 1.

FIG. 5 is a flowchart for explaining an example of a method for manufacturing the chip inductor 1 depicted in FIG. 1. FIGS. 6A, 6B, 6C, 6D, 6E, 6F, 6G, 6H, 6I, 6J, 6K, 6L, 6M, 6N, 6O, 6P and 6Q are sectional views for explaining an example of the method for manufacturing the chip inductor 1 depicted in FIG. 1.

Figure 6C:
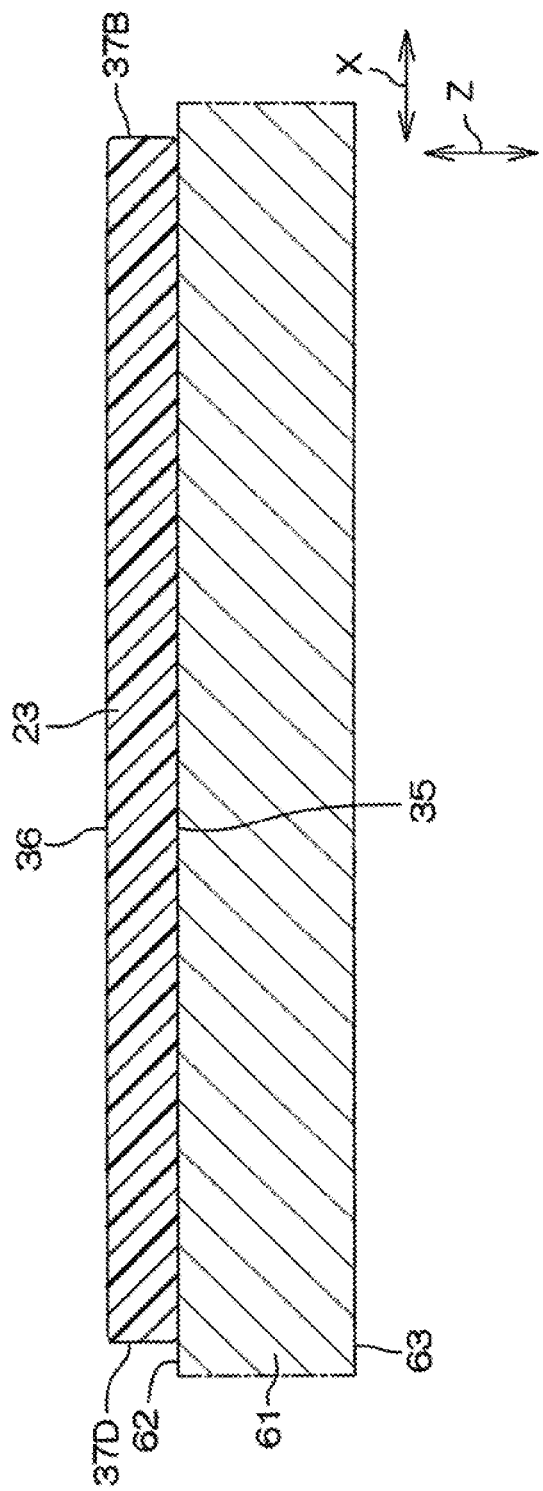
FIG. 6C is a sectional view illustrating a step after the step of FIG. 6B.

First, referring to FIG. 6A, a supporting member 61 is prepared in Step S1 in FIG. 5. The supporting member 61 has a first face 62 on one side and a second face 63 on the other side. One or plural chip inductors 1 are produced on the first face 62 of the supporting member 61. In this configuration, a plurality of chip inductors 1 are produced on the first face 62 of the supporting member 61. FIGS. 6A, 6B, 6C, 6D, 6E, 6F, 6G, 6H, 6I, 6J, 6K, 6L, 6M, 6N, 6O, 6P and 6Q depict only a region where one chip inductor 1 is formed.

The sealing resin 2 in the chip inductor 1 is produced on the supporting member 61, then the sealing resin 2 is detached from the supporting member 61. The supporting member 61 may be a member removable from the sealing resin 2. The supporting member 61 may be a member removable by grinding. The supporting member 61 may be a member removable by etching while leaving the sealing resin 2.

The supporting member 61 may include a metal substrate, an insulating substrate, or a semiconductor substrate. The metal substrate may be a copper substrate, an aluminum substrate, a stainless steel substrate, or the like. The insulating substrate may be a silicon oxide substrate, a silicon nitride substrate, a ceramic substrate, or the like. The semiconductor substrate may be a silicon substrate, a GaN substrate, a silicon carbide substrate, or the like. In this process, a silicon substrate is adopted as the supporting member 61.

Subsequently, referring to FIG. 6B, a base resin protective layer 64 as a base for the resin protective layer 23 is formed on the first face 62 of the supporting member 61 in Step S2 in FIG. 5. The base resin protective layer 64 contains a negative type photosensitive resin. The base resin protective layer 64 is formed by sticking a sheet-like or film-like photosensitive resin (epoxy resin in this configuration) onto the first face 62 of the supporting member 61.

Subsequently, referring to FIG. 6C, the base resin protective layer 64 is selectively exposed and developed in Step S3 in FIG. 5. Thereby, the resin protective layer 23 is formed.

The resin protective layer 23 can also be formed in such a way that a photosensitive resin (epoxy resin in this configuration) is applied on the first face 62 of the supporting member 61, and then selectively exposed and developed. The sheet-like or film-like photosensitive resin has an advantage from the viewpoint that the thickness of the resin protective layer 23 can be appropriately and easily adjusted.

Figure 6D:
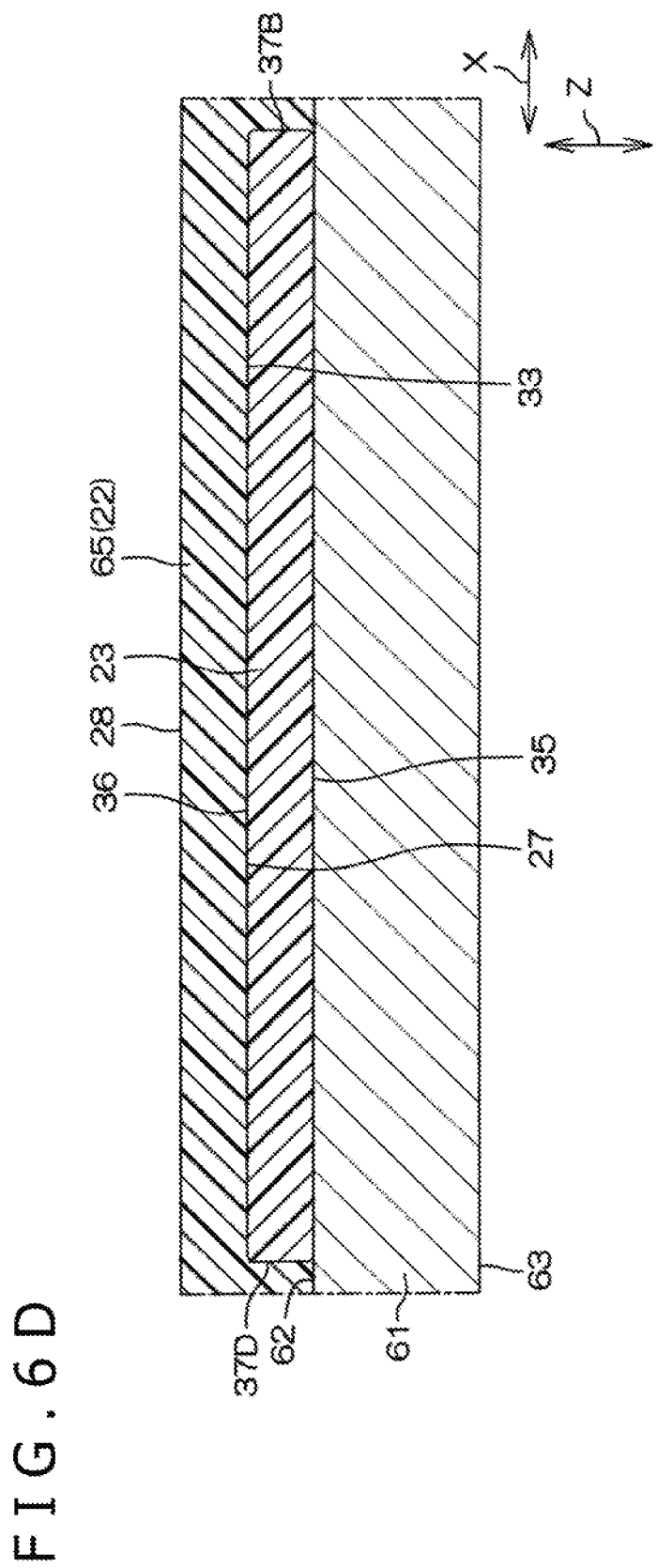
FIG. 6D is a sectional view illustrating a step after the step of FIG. 6C.

Subsequently, referring to FIG. 6D, a base resin wiring layer 65 as a base for the resin wiring layer 22 is formed on the first face 62 of the supporting member 61 so as to cover the resin protective layer 23 in Step S4 in FIG. 5. The base resin wiring layer 65 contains a negative type photosensitive resin.

The base resin wiring layer 65 is formed by sticking the sheet-like or film-like photosensitive resin (epoxy resin in this configuration) onto the first face 62 of the supporting member 61 so as to cover the resin protective layer 23.

Figure 6E:
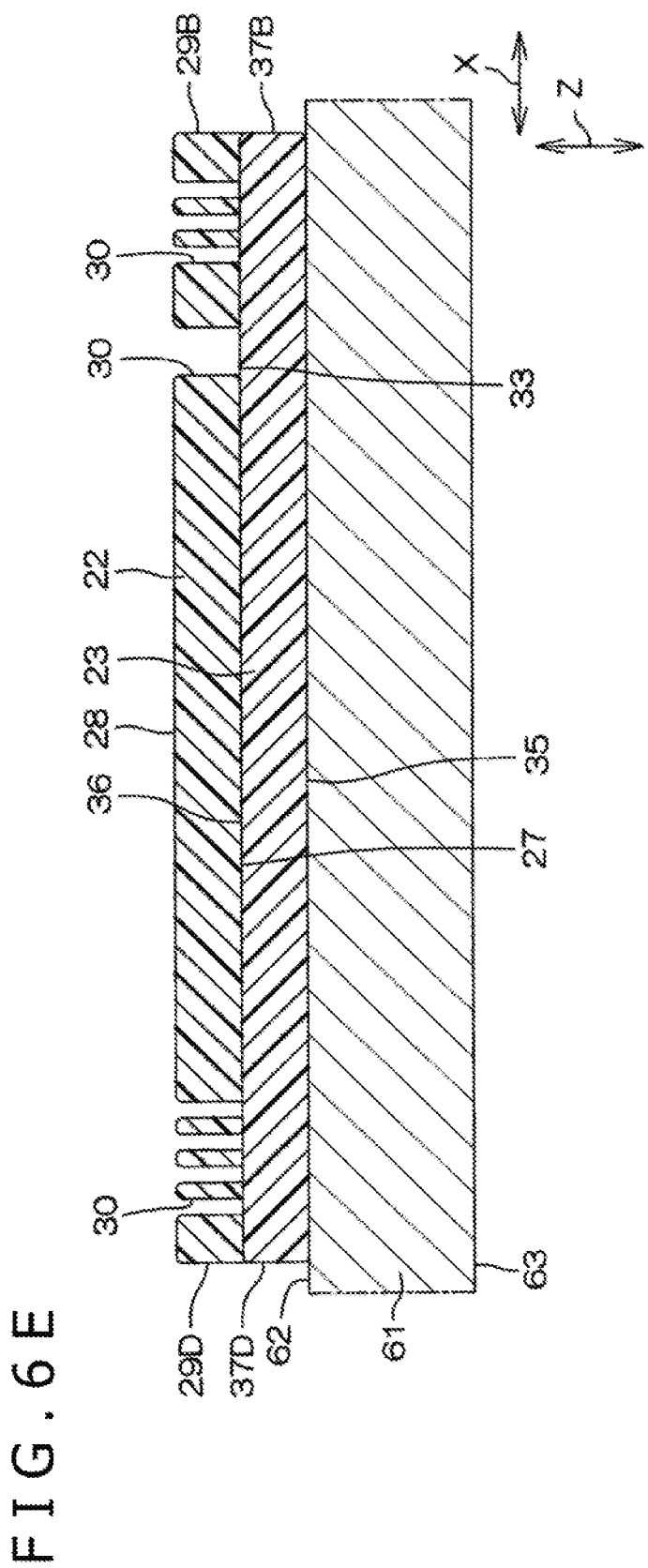
FIG. 6E is a sectional view illustrating a step after the step of FIG. 6D.

Subsequently, referring to FIG. 6E, the base resin wiring layer 65 is selectively exposed and developed in Step S5 in FIG. 5. Thereby, the resin wiring layer 22 having the coil trench 30 exposing the resin protective layer 23 is formed.

The resin wiring layer 22 can also be formed in such a way that the photosensitive resin (epoxy resin in this configuration) is applied on the first face 62 of the supporting member 61 so as to cover the resin protective layer 23, and then selectively exposed and developed. The sheet-like or film-like photosensitive resin has an advantage from the viewpoint that the thickness of the resin wiring layer 22 can be appropriately and easily adjusted.

Figure 6F:
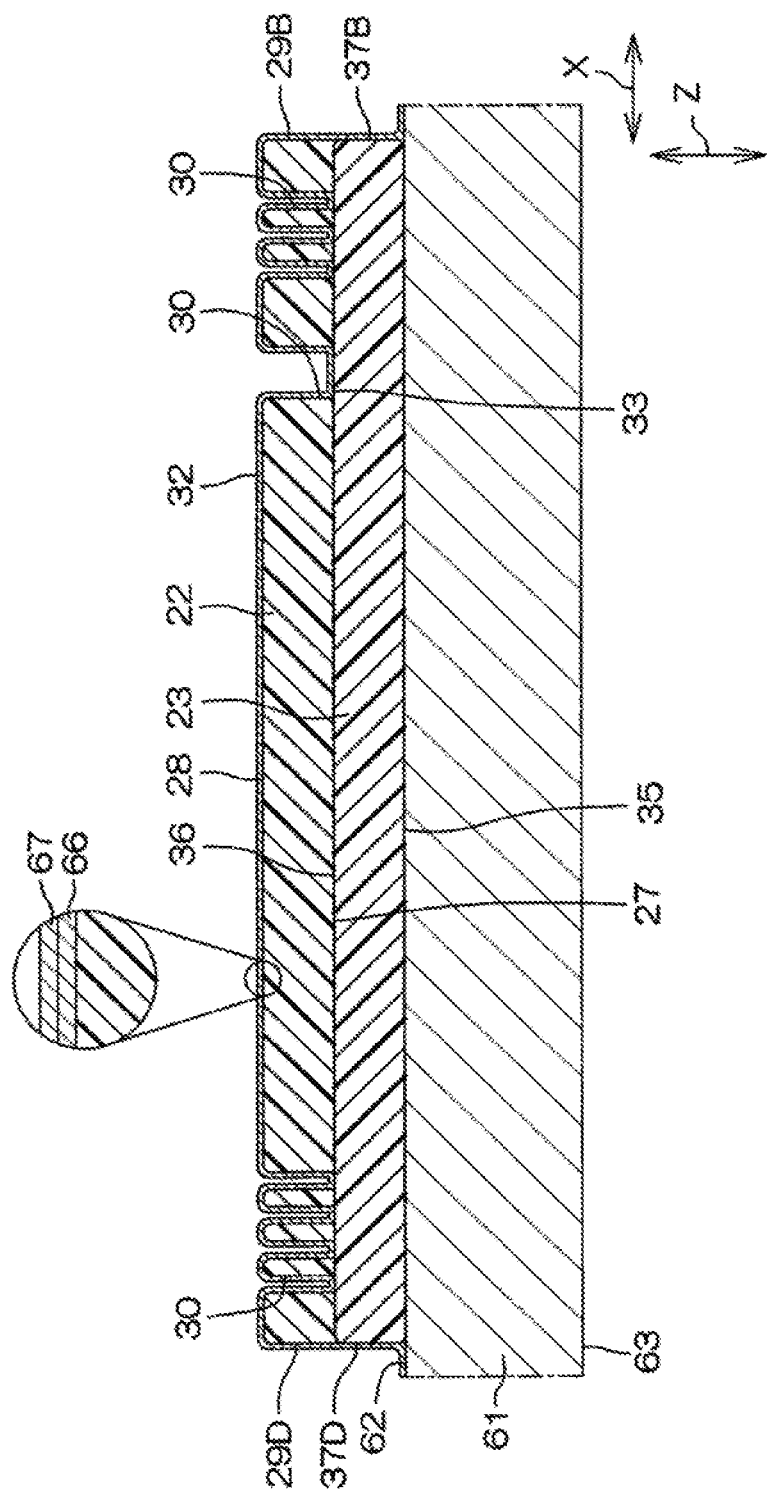
FIG. 6F is a sectional view illustrating a step after the step of FIG. 6E.

Subsequently, referring to FIG. 6F, a base barrier electrode layer 66 as a base for the barrier electrode layer 32 of the coil conductor 3 is formed in Step S6 in FIG. 5. The base barrier electrode layer 66 contains Ti. The base barrier electrode layer 66 may be formed by sputtering.

Subsequently, a seed electrode layer 67 is formed on the base barrier electrode layer 66. The seed electrode layer 67 contains Cu. The seed electrode layer 67 may be formed by sputtering.

Figure 6G:
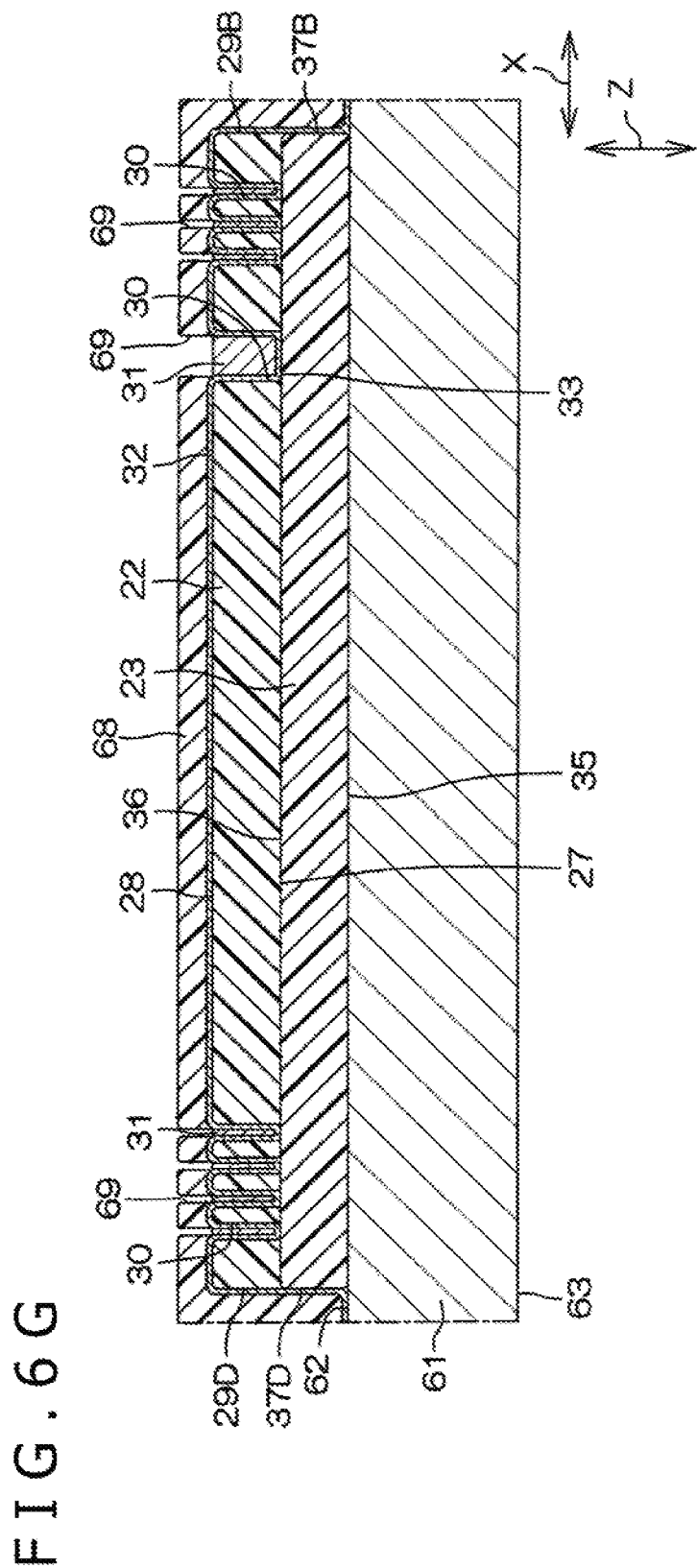
FIG. 6G is a sectional view illustrating a step after the step of FIG. 6F.

Subsequently, referring to FIG. 6G, a resist mask 68 having a predetermined pattern is formed on the first face 62 of the supporting member 61 so as to cover the seed electrode layer 67 in Step S7 in FIG. 5. The resist mask 68 has an opening 69 for exposing a portion formed in the coil trench 30 on the seed electrode layer 67.

Subsequently, the main electrode layer 31 is embedded in the recess space partitioned by the base barrier electrode layer 66 in Step S8 in FIG. 5. The main electrode layer 31 contains Cu. The main electrode layer 31 is integrated with the seed electrode layer 67. The main electrode layer 31 may be formed by a copper electroplating method through the resist mask 68.

Subsequently, referring to FIG. 6H, the resist mask 68 is removed in Step S9 in FIG. 5.

Figure 6I:
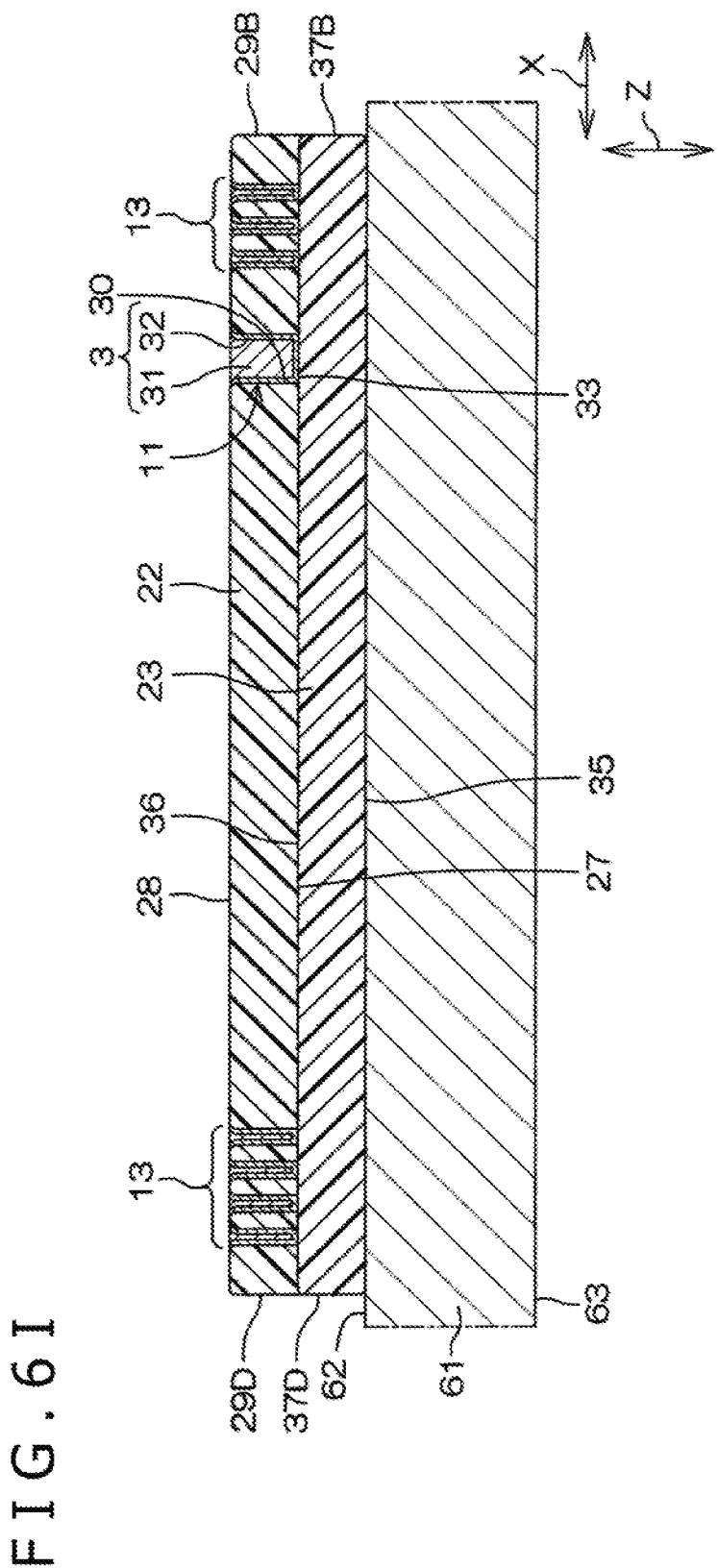
FIG. 6I is a sectional view illustrating a step after the step of FIG. 6H.

Subsequently, referring to FIG. 6I, portions exposed from the coil trench 30 on the base barrier electrode layer 66 and the seed electrode layer 67 are removed in Step S10 in FIG. 5. Unnecessary portions on the base barrier electrode layer 66 and the seed electrode layer 67 may be removed by etching (e.g. wet etching). Thereby, the coil conductor 3 is formed.

Figure 6J:
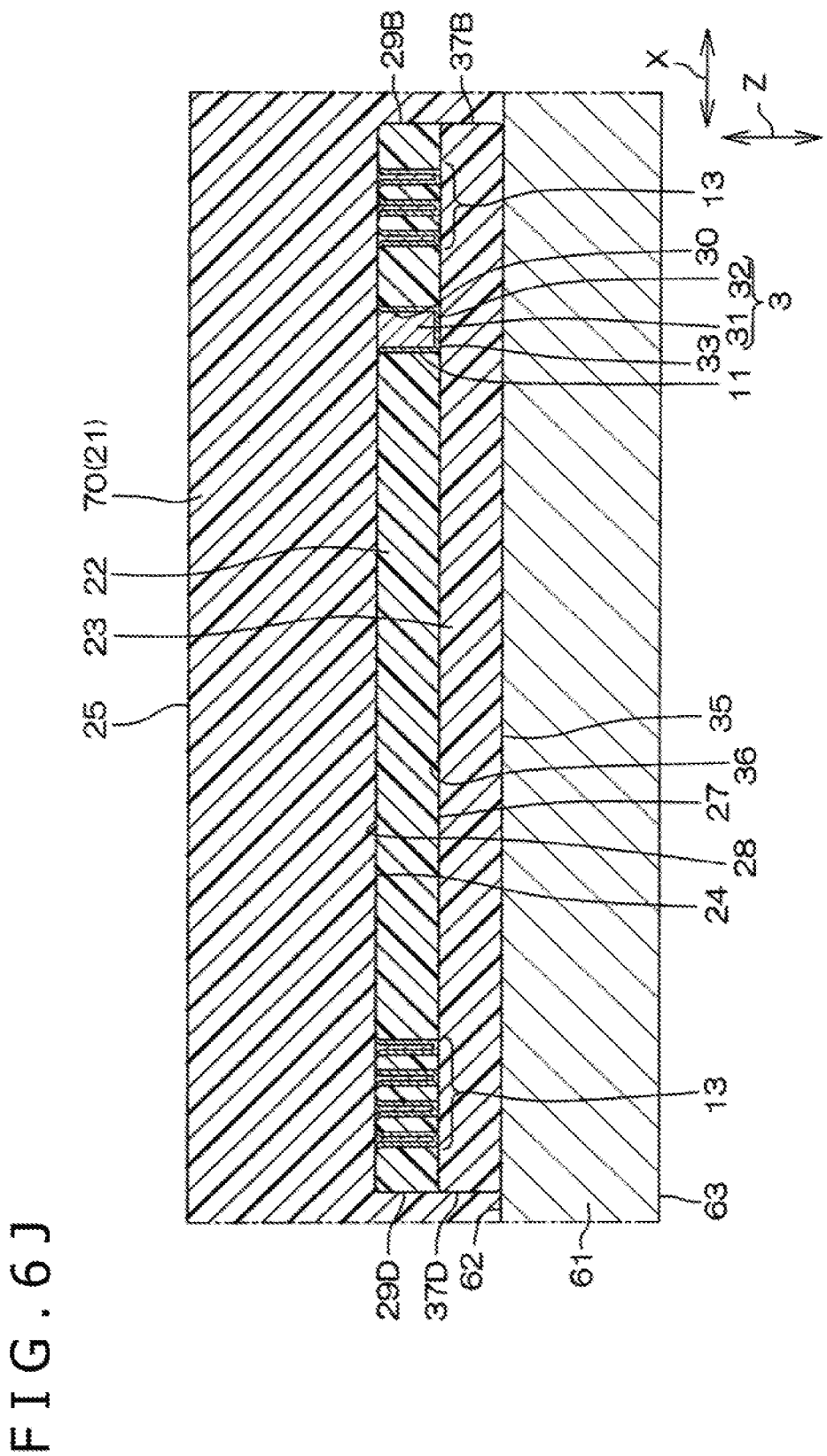
FIG. 6J is a sectional view illustrating a step after the step of FIG. 6I.

Subsequently, referring to FIG. 6J, a base supporting resin layer 70 as a base for the supporting resin layer 21 is formed on the first face 62 of the supporting member 61 so as to cover the resin wiring layer 22 in Step S11 in FIG. 5. The base supporting resin layer 70 contains a negative type photosensitive resin.

The base supporting resin layer 70 is formed by sticking the sheet-like or film-like photosensitive resin (epoxy resin in this configuration) onto the first face 62 of the supporting member 61 so as to cover the resin wiring layer 22.

Figure 6K:
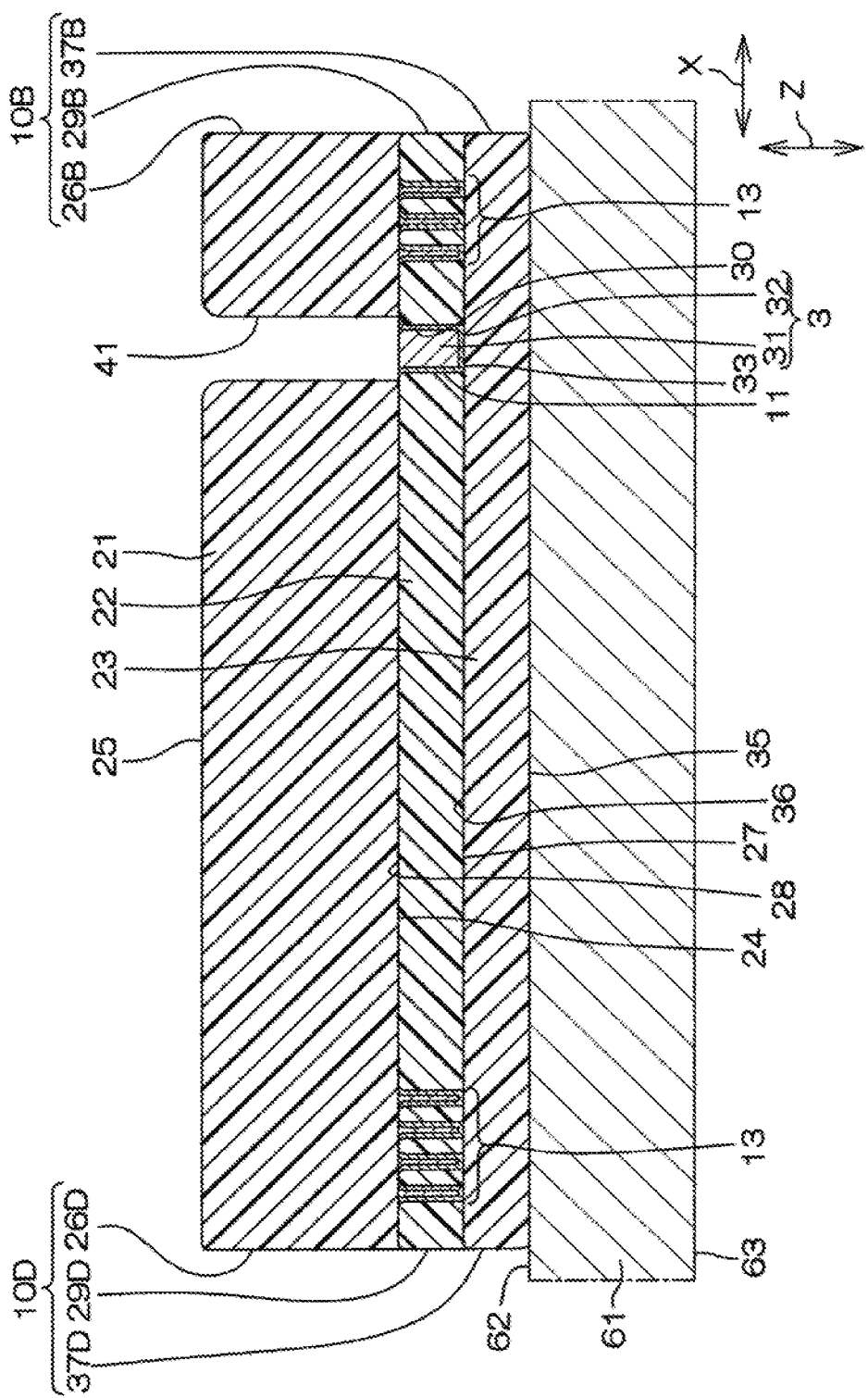
FIG. 6K is a sectional view illustrating a step after the step of FIG. 6J.

Subsequently, referring to FIG. 6K, the base supporting resin layer 70 is selectively exposed and developed in Step S12 in FIG. 5. Thereby, the supporting resin layer 21 having the inner contact hole 41 and the outer contact hole 42 is formed. In addition, thereby, the sealing resin 2 including the supporting resin layer 21, the resin wiring layer 22, and the resin protective layer 23 is formed.

The supporting resin layer 21 can also be formed in such a way that the photosensitive resin (epoxy resin in this configuration) is applied on the first face 62 of the supporting member 61 so as to cover the resin wiring layer 22, and then selectively exposed and developed. The sheet-like or film-like photosensitive resin has an advantage from the viewpoint that the thickness of the supporting resin layer 21 can be appropriately and easily adjusted.

Figure 6L:
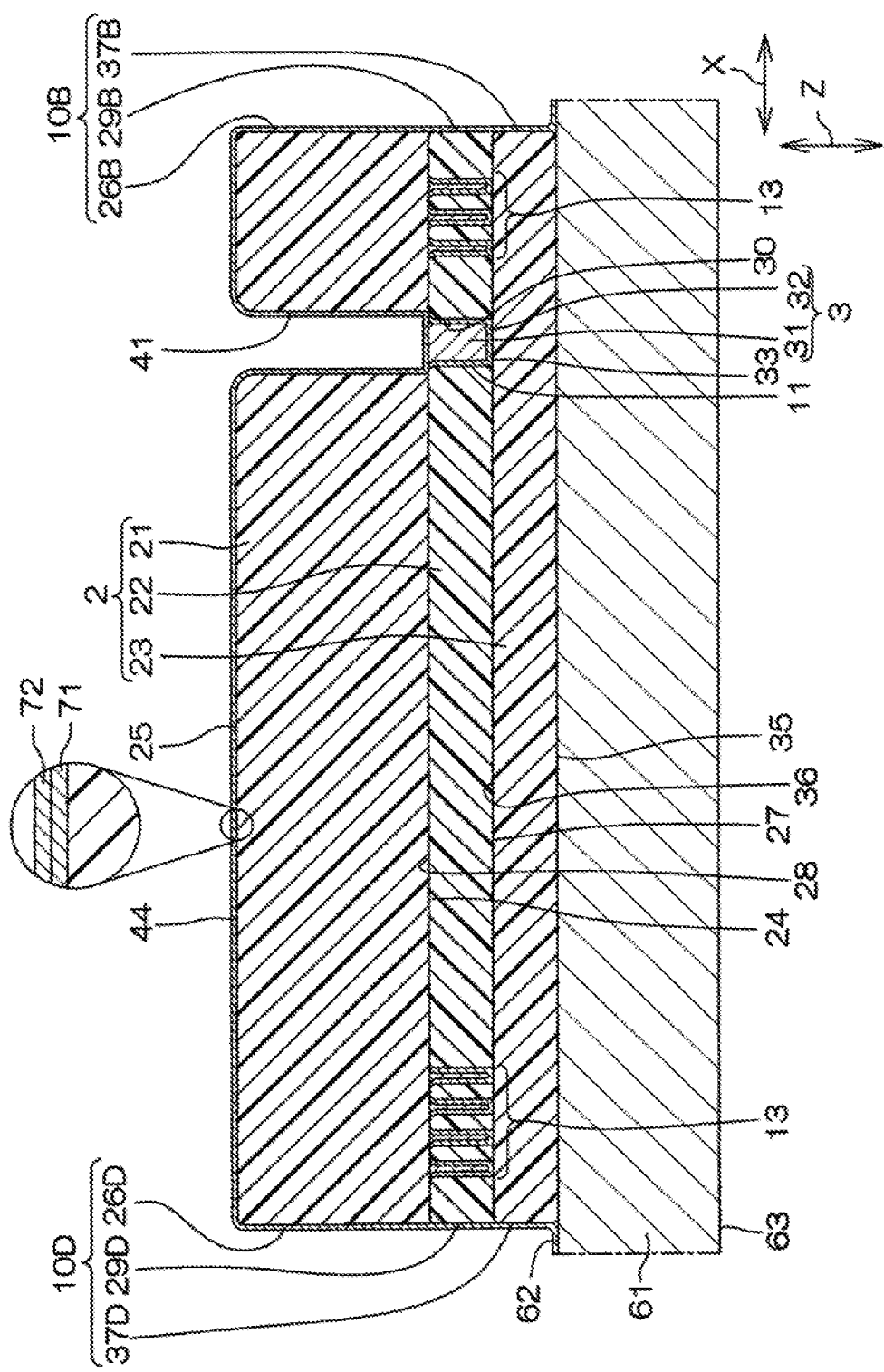
FIG. 6L is a sectional view illustrating a step after the step of FIG. 6K.

Subsequently, referring to FIG. 6L, a base barrier electrode layer 71 as a base for the barrier electrode layer 44 of the inner terminal 4 and the outer terminal 5 is formed in Step S13 in FIG. 5. The base barrier electrode layer 71 contains Ti. The base barrier electrode layer 71 may be formed by sputtering. Subsequently, a seed electrode layer 72 is formed on the base barrier electrode layer 71. The seed electrode layer 72 contains Cu. The seed electrode layer 72 may be formed by sputtering.

Subsequently, referring to FIG. 6M, a resist mask 73 having a predetermined pattern is formed on the first face 62 of the supporting member 61 so as to cover the seed electrode layer 72 in Step S14 in FIG. 5. The resist mask 73 has openings 74 for exposing regions where the main electrode layers 43 of the inner terminal 4 and the outer terminal 5 should be formed on the base barrier electrode layer 71.

Subsequently, the main electrode layers 43 of the inner terminal 4 and the outer terminal 5 are formed in Step S15 in FIG. 5. The main electrode layer 43 contains Cu. The main electrode layer 43 may be formed by a copper electroplating method through the resist mask 73.

Figure 6N:
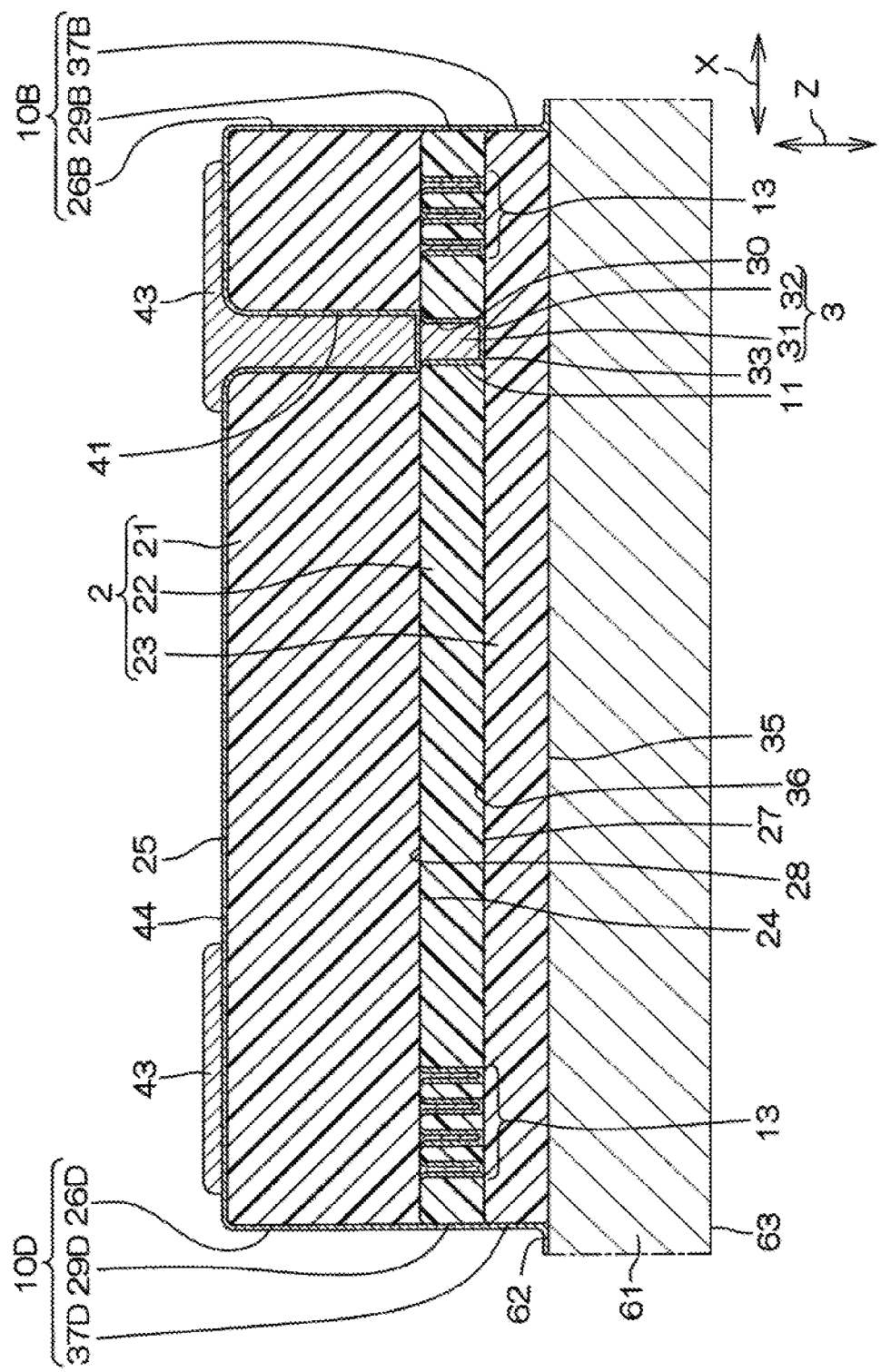
FIG. 6N is a sectional view illustrating a step after the step of FIG. 6M.
Figure 60:
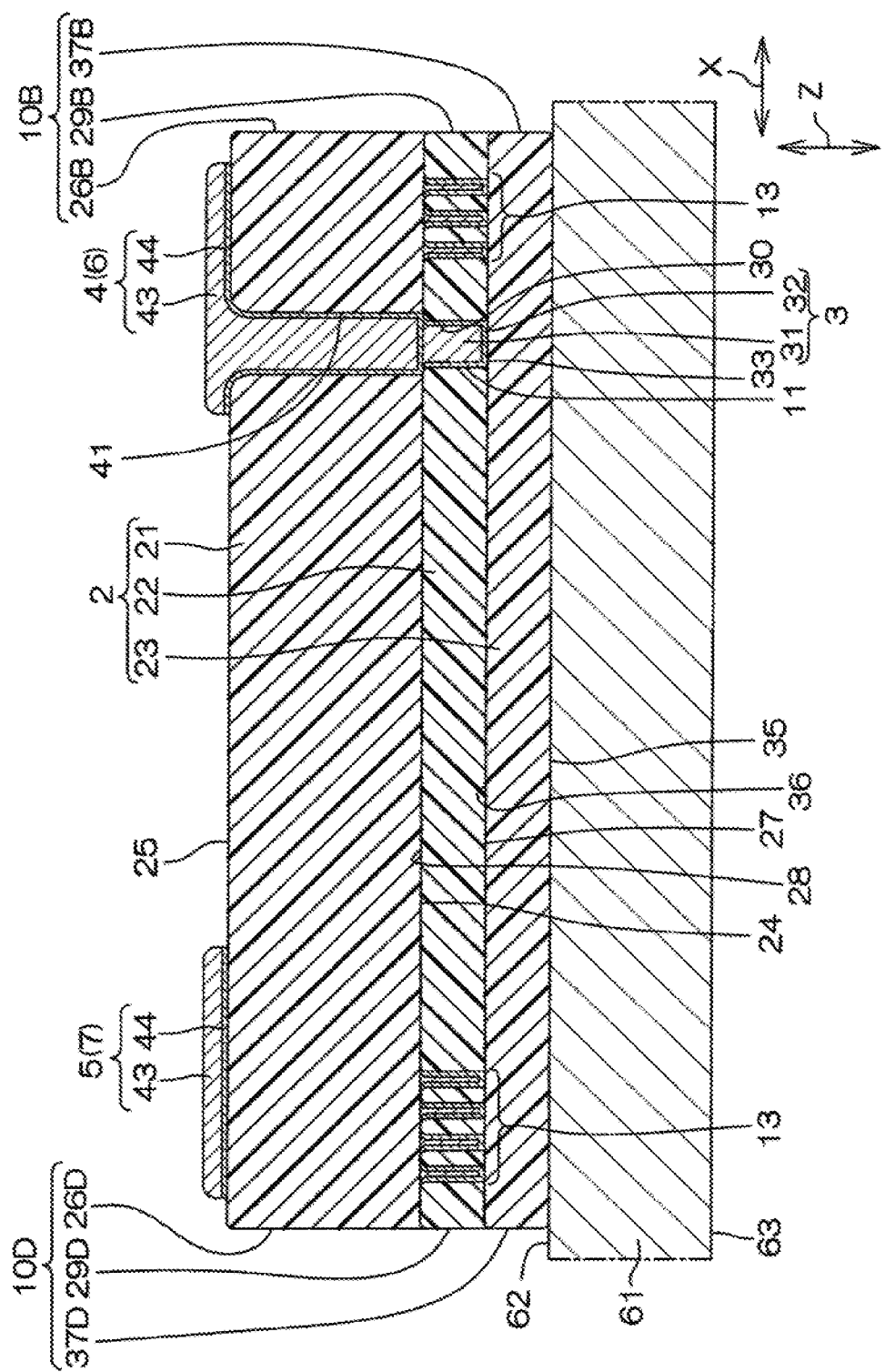

Subsequently, referring to FIG. 6N, the resist mask 73 is removed in Step S16 in FIG. 5.

Subsequently, referring to FIG. 6O, portions exposed from the main electrode layers 43 of the inner terminal 4 and the outer terminal 5 on the base barrier electrode layer 71 and the seed electrode layer 72 are removed in Step S17 in FIG. 5. Unnecessary portions on the base barrier electrode layer 71 and the seed electrode layer 72 may be removed by an etching (e.g. wet etching). Thereby, the inner terminal 4 and the outer terminal 5 are formed.

Figure 6P:
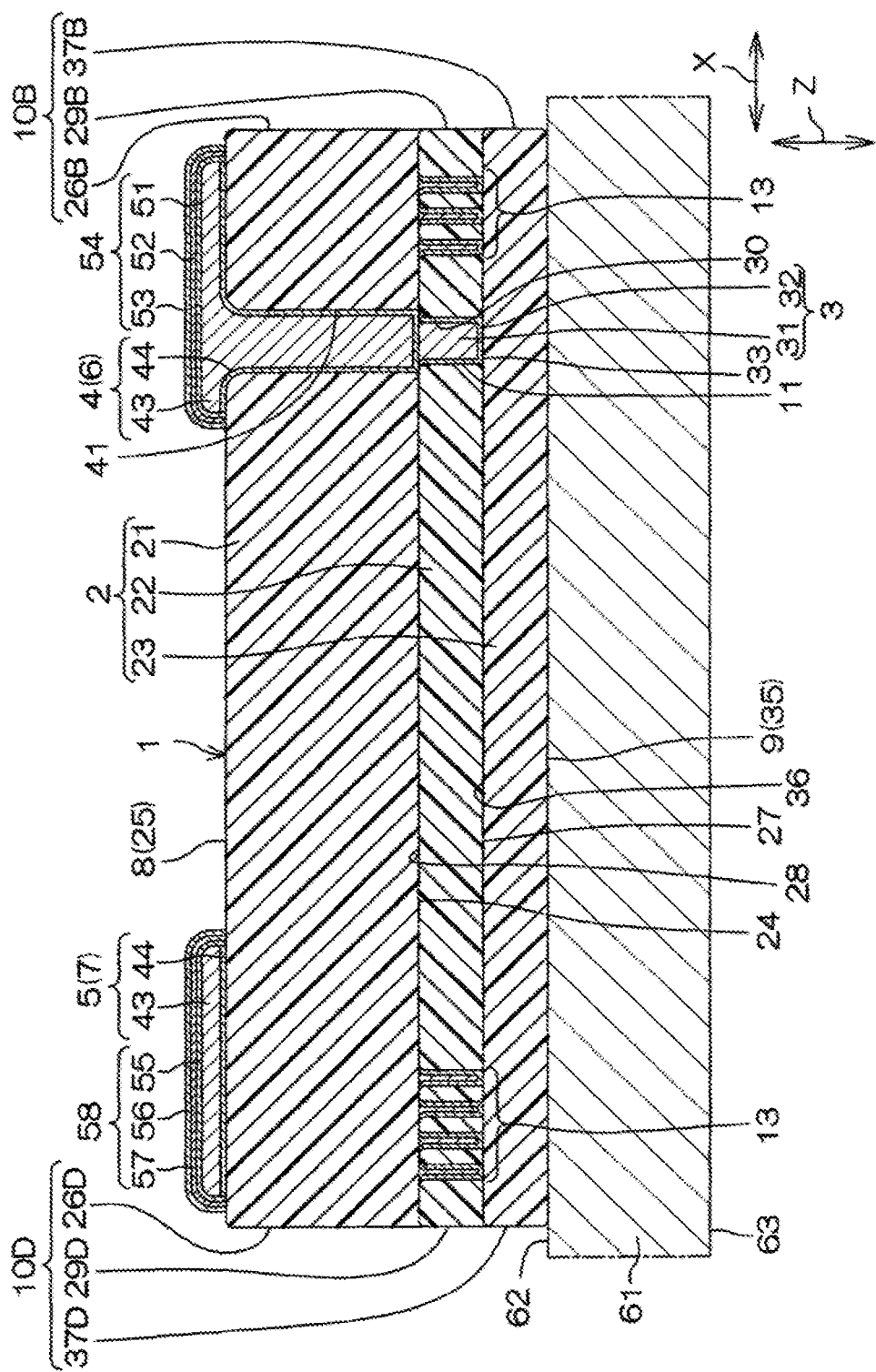
FIG. 6P is a sectional view illustrating a step after the step of FIG. 6O.

Subsequently, referring to FIG. 6P, the Ni/Pd/Au laminated structure 54 including the Ni layer 51, the Pd layer 52 and the Au layer 53 is formed on the outer face of the inner terminal 4, and the Ni/Pd/Au laminated structure 58 including the Ni layer 55, the Pd layer 56 and the Au layer 57 is formed on the outer face of the outer terminal 5 in Step S18 in FIG. 5. The Ni layer 51, the Pd layer 52 and the Au layer 53, as well as the Ni layer 55, the Pd layer 56 and the Au layer 57 may be individually formed by an electroless plating method.

Figure 6Q:
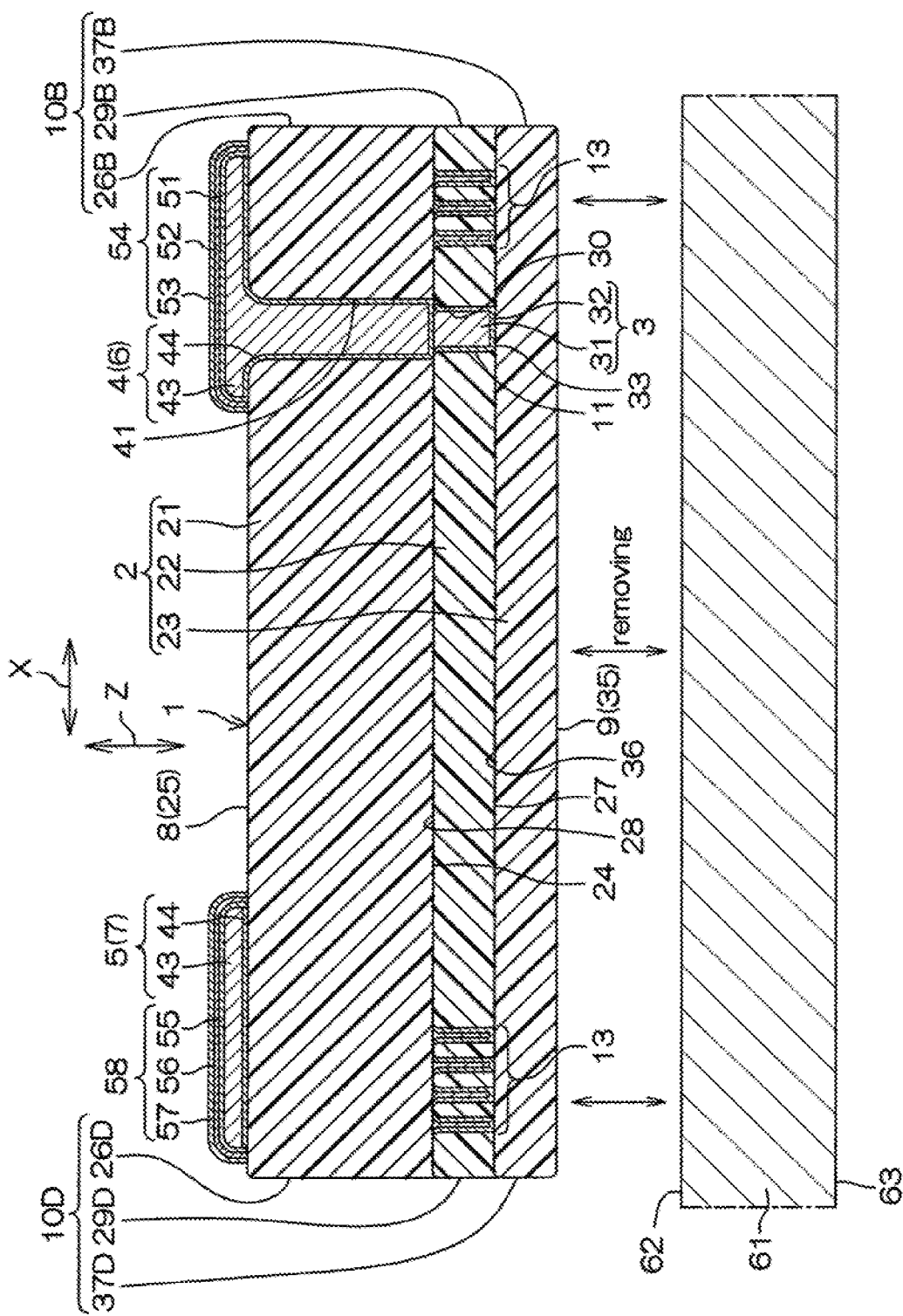
FIG. 6Q is a sectional view illustrating a step after the step of FIG. 6P.

Subsequently, referring to FIG. 6Q, the sealing resin 2 is detached from the supporting member 61 in Step S19 in FIG. 5. The step of detaching the sealing resin 2 may include a step of removing the supporting member 61 from the sealing resin 2. The step of detaching the sealing resin 2 may include a step of removing the supporting member 61.

The step of removing the supporting member 61 may include a step of removing the supporting member 61 by grinding, or a step of removing the supporting member 61 by etching. The step of removing the supporting member 61 may include a step that the supporting member 61 is ground from the side of the second face 63 until the supporting member 61 has a predetermined thickness, and then the supporting member 61 is removed by etching. The chip inductor 1 is manufactured through the process including these steps.

Figure 7:
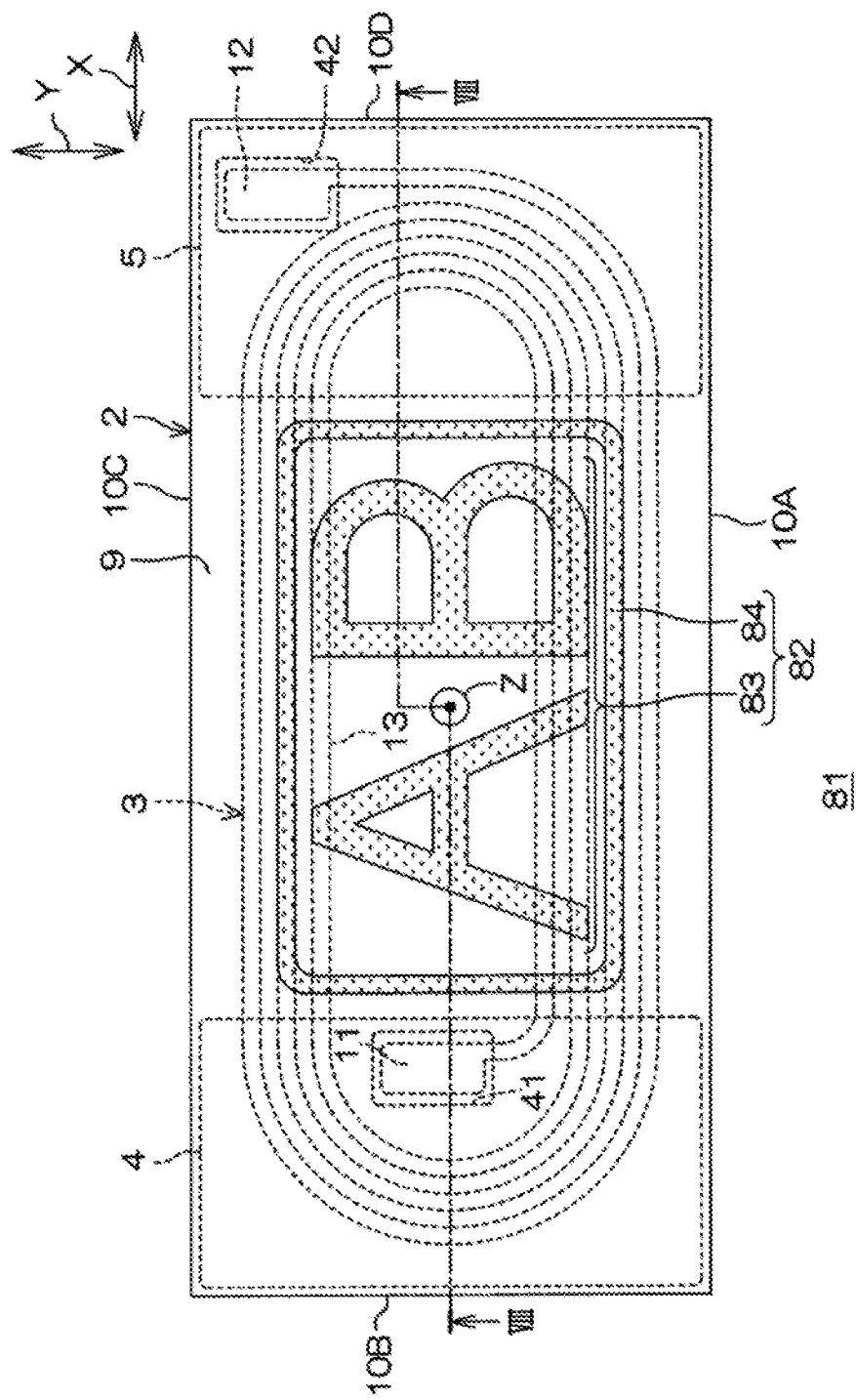
FIG. 7 is a top view illustrating a structure of a chip inductor according to a second embodiment of the present technology, the view corresponding to FIG. 2.
Figure 8:
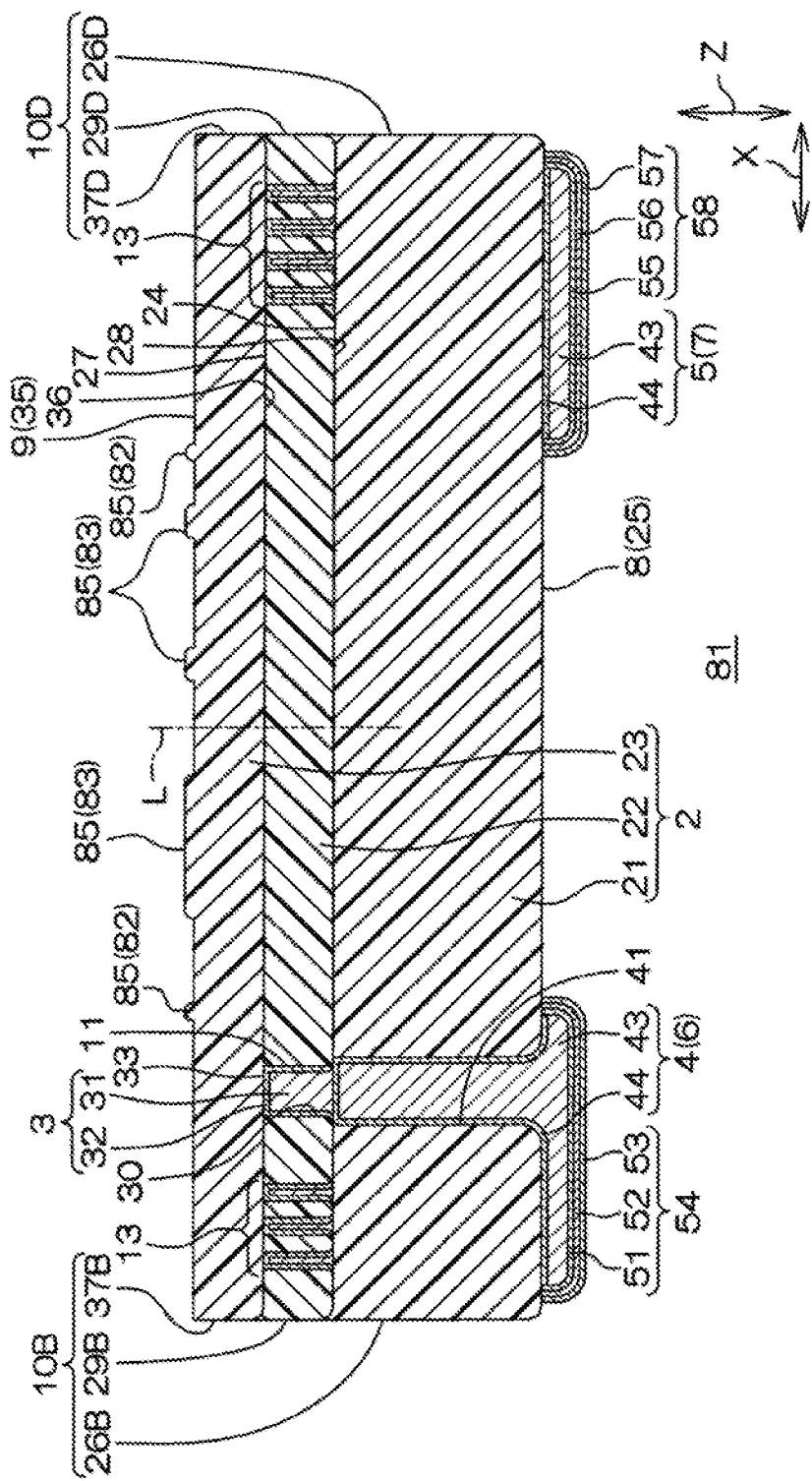
FIG. 8 is a sectional view taken along a line VIII-VIII depicted in FIG. 7.

FIG. 7 corresponds to FIG. 2, and is a top view illustrating the structure of a chip inductor 81 according to the second embodiment of the present technology. FIG. 8 is a sectional view taken along the line VIII-VIII depicted in FIG. 7. Hereinafter, with respect to the structures of the chip inductor 81 corresponding to the structures described for the chip inductor 1, the explanation is omitted by providing the same reference symbols as described for the chip inductor 1.

Referring to FIGS. 7 and 8, the chip inductor 81 further includes a mark 82 formed on the non-mounting face 9 of the sealing resin 2. FIGS. 7 and 8 depict a character pattern 83 including characters "A" and "B," and the mark 82 having a frame pattern 84 surrounding the character pattern 83 as an example.

However, the mark 82 can actually present a logo mark, a picture, a character, a symbol, or any information regarding the chip inductor 81, alternatively a combined information thereof, or the like.

Any information regarding the chip inductor 81 includes various information regarding the specifications of the chip inductor 81 e.g. model number, size, shape, manufacturing date, inductance value, rated voltage, rated current, etc.

Referring to FIG. 8, the mark 82 includes recess and projection formed of a part of the non-mounting face 9 of the sealing resin 2. In this configuration, the mark 82 includes a protruding portion 85 as a form of the recess and projection. The outer face of the protruding portion 85 (recess and projection) changes a reflection direction and a refraction direction of light incident on the non-mounting face 9 of the sealing resin 2. As a result, the protruding portion 85 (recess and projection) is visually recognized as the mark 82.

As described hereinbefore, also for the chip inductor 81, effects similar to the effects described for the chip inductor 1 can be generated. Also, the chip inductor 81 allows the mark 82 to be formed on the non-mounting face 9 of the sealing resin 2. Thereby, various information can be obtained from the mark 82, and thus convenience of the miniaturized chip inductor 81 can be enhanced.

Figure 9:
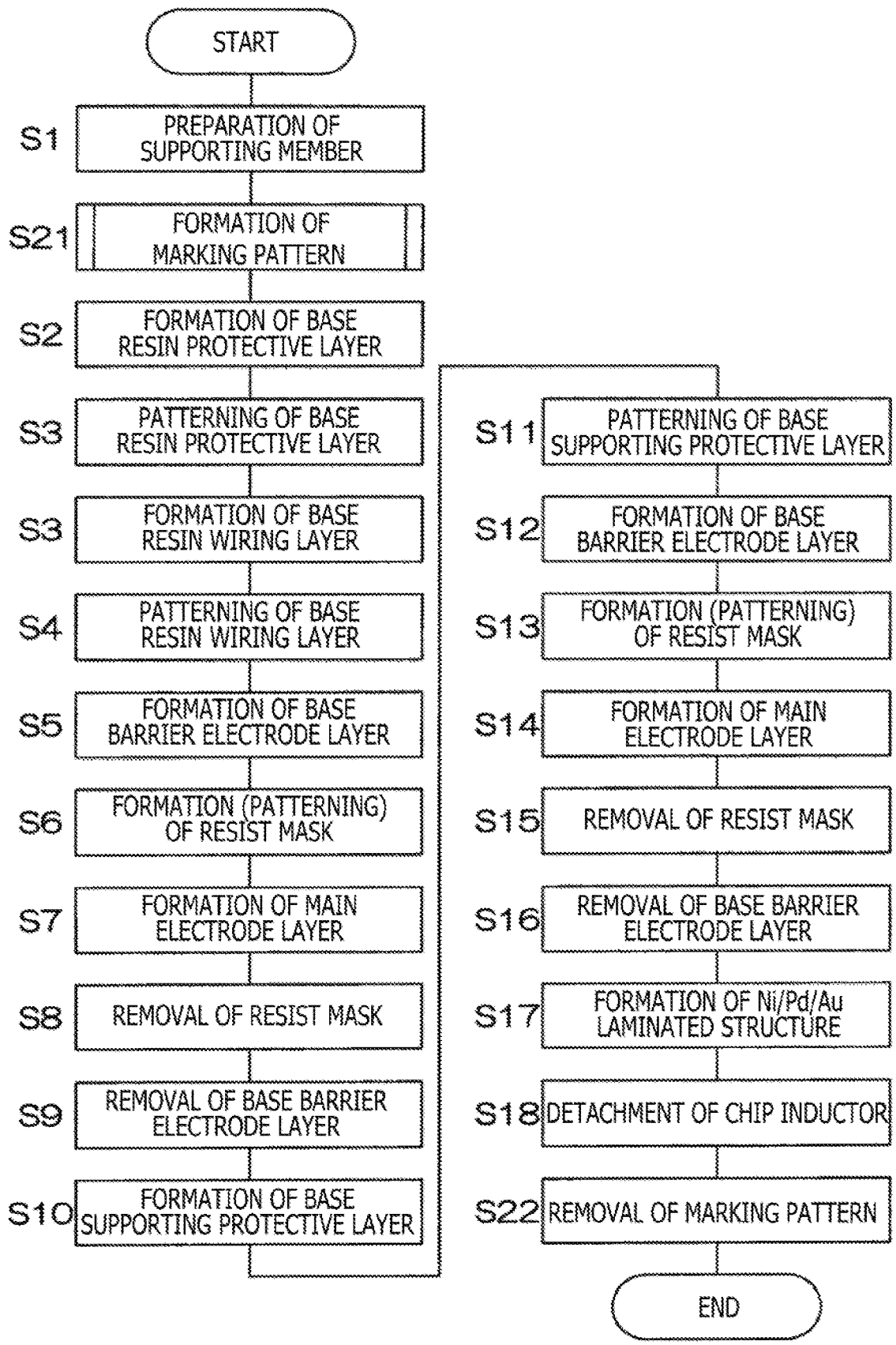
FIG. 9 is a flowchart for explaining an example of a method for manufacturing the chip inductor depicted in FIG. 7.

FIG. 9 is a flowchart for explaining an example of the method for manufacturing the chip inductor 1 depicted in FIG. 7.

Referring to FIG. 9, the method for manufacturing the chip inductor 81 is different from the method for manufacturing the chip inductor 1 from the viewpoint that the method for manufacturing the chip inductor 81 includes the step of forming the marking pattern in Step S21 in FIG. 9, and the step of removing the marking pattern in Step S22 in FIG. 9.

After the step of preparing the supporting member 61 in Step S1 in FIG. 9, the step of forming the marking pattern in Step S21 in FIG. 9 is carried out prior to the step of forming the base resin protective layer 64 in Step S2 in FIG. 9. The step of removing the marking pattern in Step S22 in FIG. 9 is carried out after the step of detaching the sealing resin 2 in Step S18 in FIG. 9.

FIG. 10 is a flowchart for explaining the step of Step S21 depicted in FIG. 9. FIGS. 11A, 11B, 11C, 11D, 11E and 11 are sectional views for explaining an example of the method for manufacturing the chip inductor 81 depicted in FIG. 7.

First, referring to 11A, in the step of forming the marking pattern in Step S21 in FIGS. 9 and 10, a marking material layer 86 is formed on the first face 62 of the supporting member 61 in Step S23 in FIG. 10. Preferably, the marking material layer 86 includes a material removable by etching while leaving the supporting member 61. The marking material layer 86 may have a thickness of 0.5 to 5 µm (e.g. approximately 1 µm).

The marking material layer 86 may contain a metal material, a semiconductor material, or an insulating material. In this configuration, the marking material layer 86 contains silicon oxide. The marking material layer 86 may be formed by a chemical vapor deposition (CVD) method.

Figure 11B:
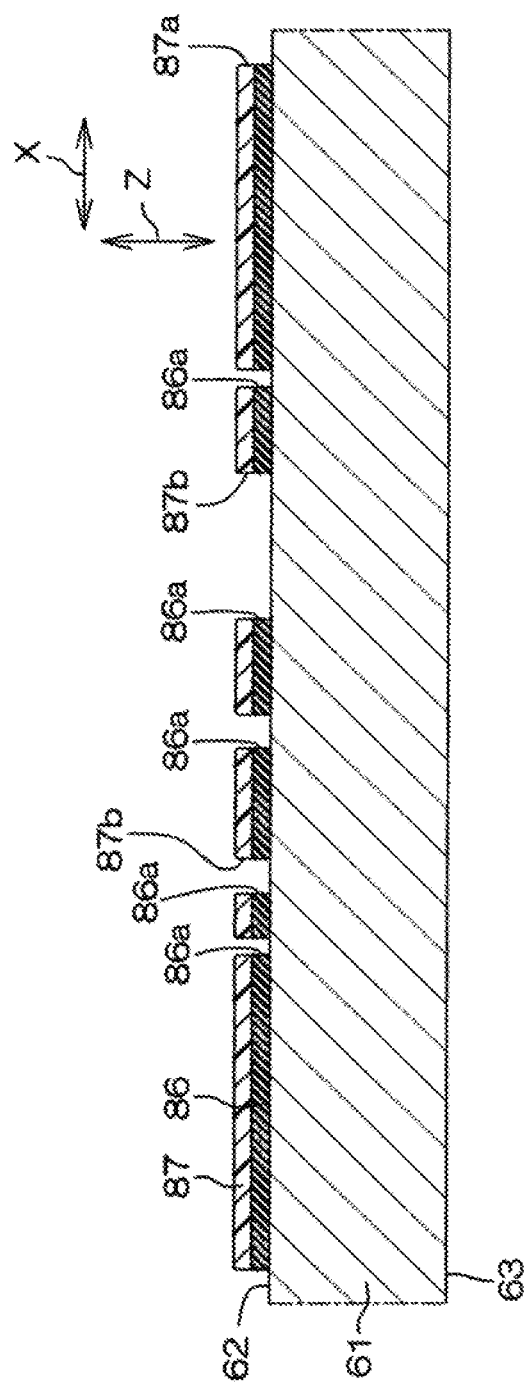
FIG. 11B is a sectional view illustrating a step after the step of FIG. 11A.

Subsequently, referring to FIG. 11B, a resist mask 87 having a predetermined pattern is formed on the marking material layer 86 in Step S24 in FIG. 10. The resist mask 87 includes a chip pattern 87a covering a region where the chip inductor 81 should be formed on the first face 62 of the supporting member 61.

In addition, the resist mask 87 has an opening 87b constituted of a reversed pattern obtained by horizontally reversing the planar pattern of the mark 82 to be formed, in the chip pattern 87a. Subsequently, unnecessary portions on the marking material layer 86 are removed by etching through the resist mask 87.

Figure 11C:
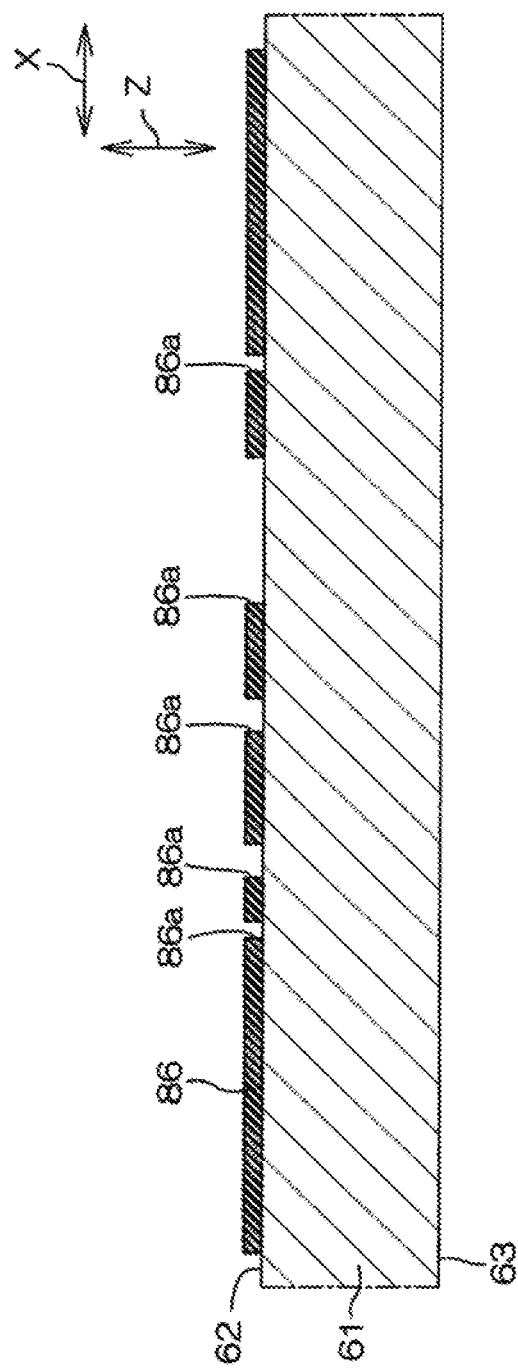
FIG. 11C is a sectional view illustrating a step after the step of FIG. 11B.

Subsequently, referring to FIG. 11C, the resist mask 87 is removed in Step S25 in FIG. 10. Thereby, a marking pattern groove 86a constituted of a reversed pattern obtained by horizontally reversing the planar pattern of the mark 82 to be formed, is formed on the marking material layer 86. The marking pattern is formed of the marking material layer 86 having the marking pattern groove 86a.

Figure 11D:
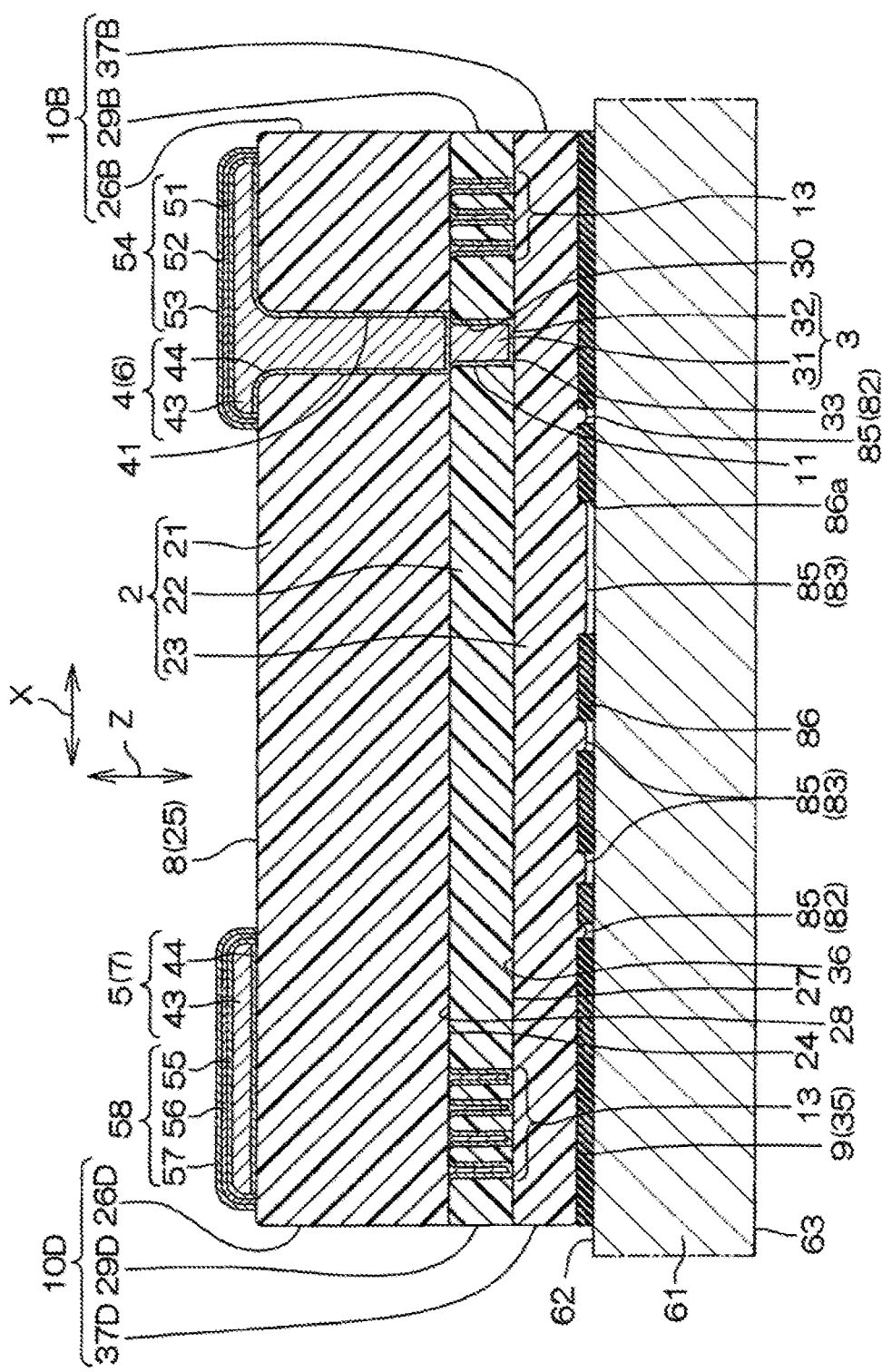
FIG. 11D is a sectional view illustrating a step after the step of FIG. 11C.

Subsequently, referring to FIG. 11D, Steps S2 to S17 in FIG. 10 are sequentially carried out. Thereby, the sealing resin 2 having a structure that a part of the non-mounting face 9 of the sealing resin 2 is embedded in the marking pattern groove 86a of the marking material layer 86, is formed.

Figure 11E:
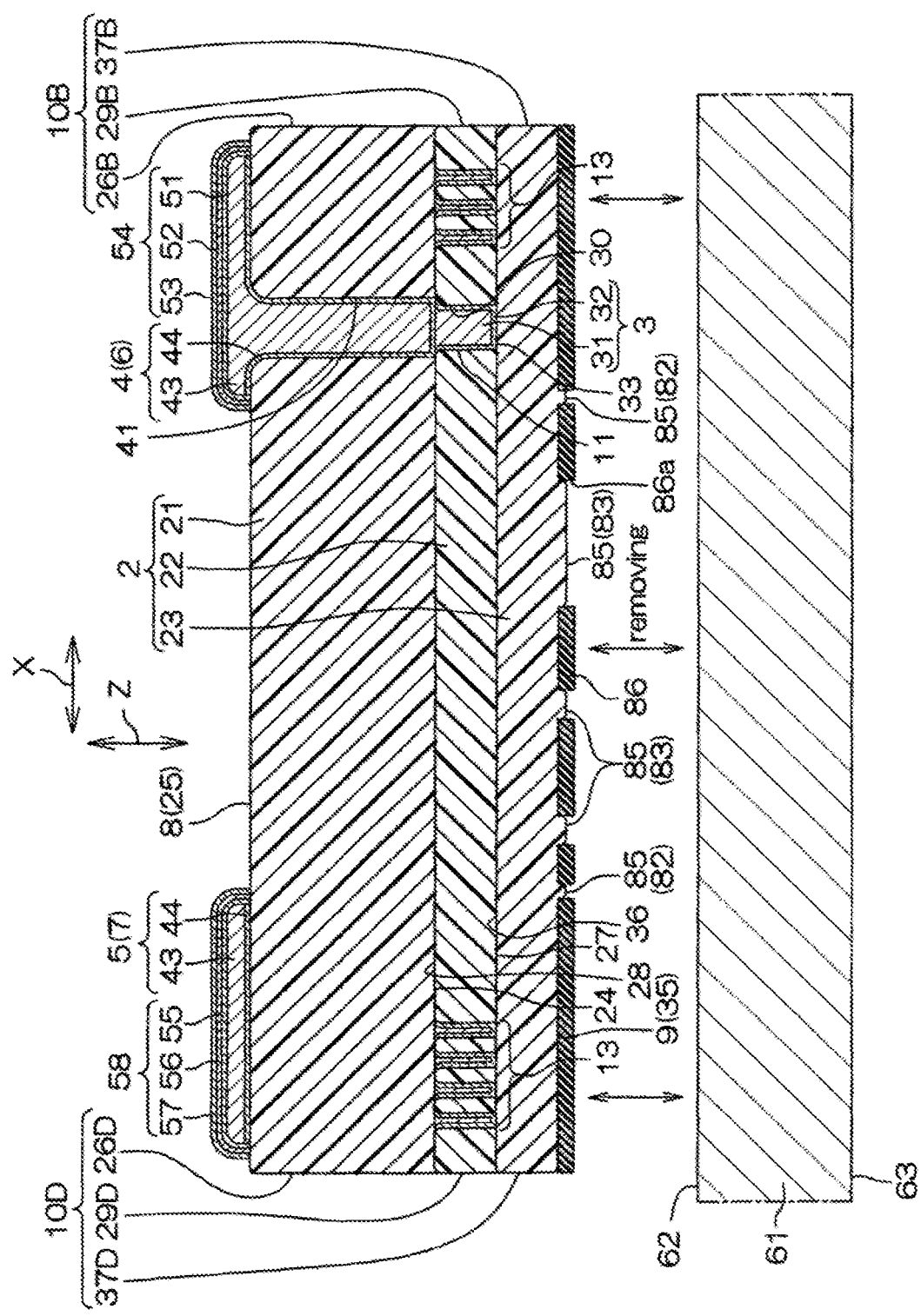
FIG. 11E is a sectional view illustrating a step after the step of FIG. 11D.

Subsequently, referring to FIG. 11E, the sealing resin 2 is detached together with the marking material layer 86 from the supporting member 61 in Step S18 in FIG. 10. As a result, the marking material layer 86 formed on the supporting member 61 is transferred to the non-mounting face 9 of the sealing resin 2.

Figure 11F:
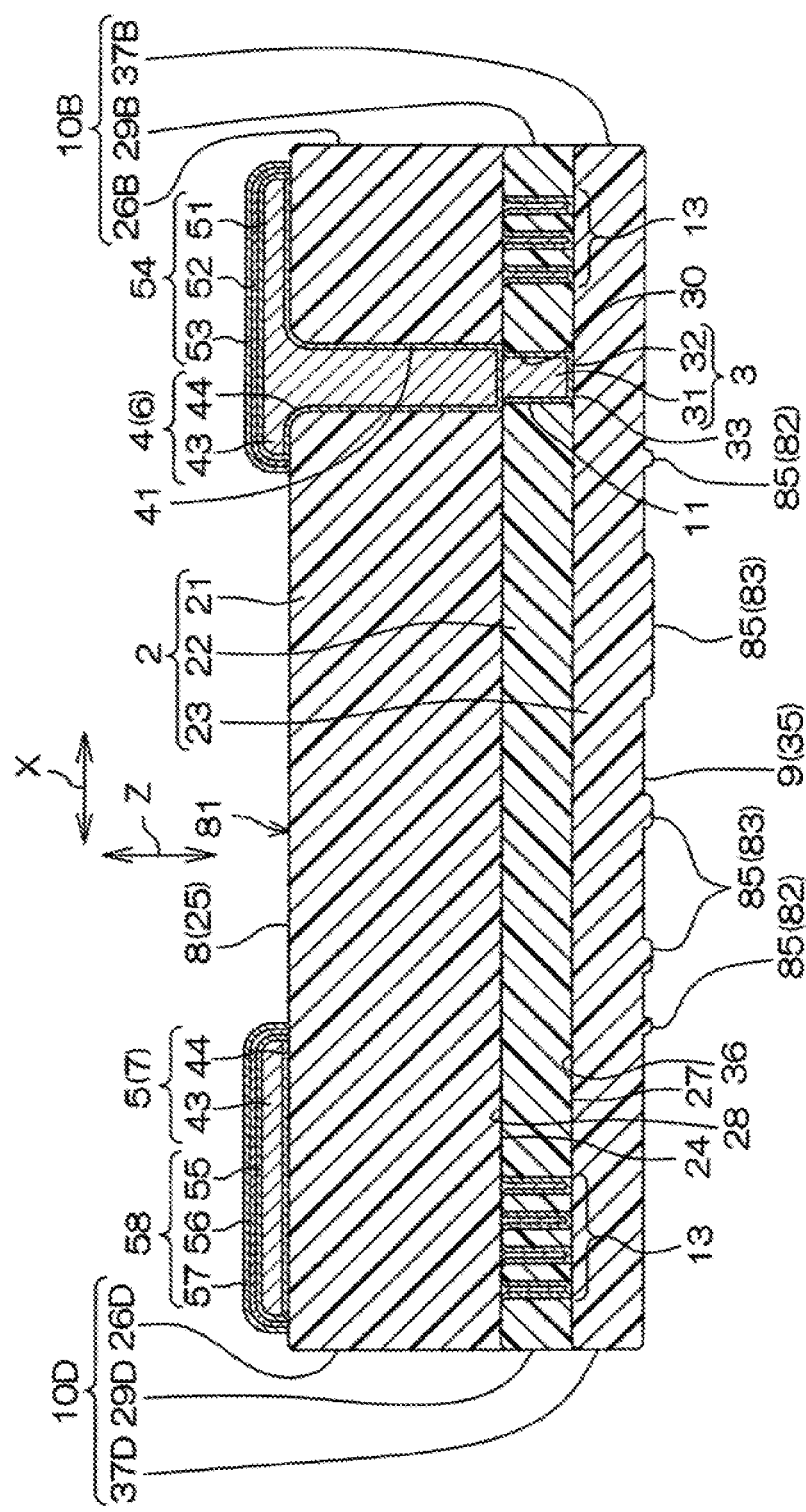
FIG. 11F is a sectional view illustrating a step after the step of FIG. 11E.

Subsequently, referring to FIG. 11F, the marking material layer 86 is removed in Step S22 in FIG. 10. The marking material layer 86 may be removed by etching (e.g. wet etching).

In this process, a trace (formation history) of the marking material layer 86 remains on the outer face of the sealing resin 2. More specifically, a trace of the marking pattern groove 86a remains on the non-mounting face 9 of the sealing resin 2.

The trace of the marking pattern groove 86a is the mark 82. More specifically, the trace of the marking pattern groove 86a includes the protruding portion 85 (marking recess and projection) formed on the non-mounting face 9 of the sealing resin 2. Through the process including the steps described hereinbefore, the chip inductor 81 having the mark 82 on the non-mounting face 9 of the sealing resin 2 is formed.

Figure 12:
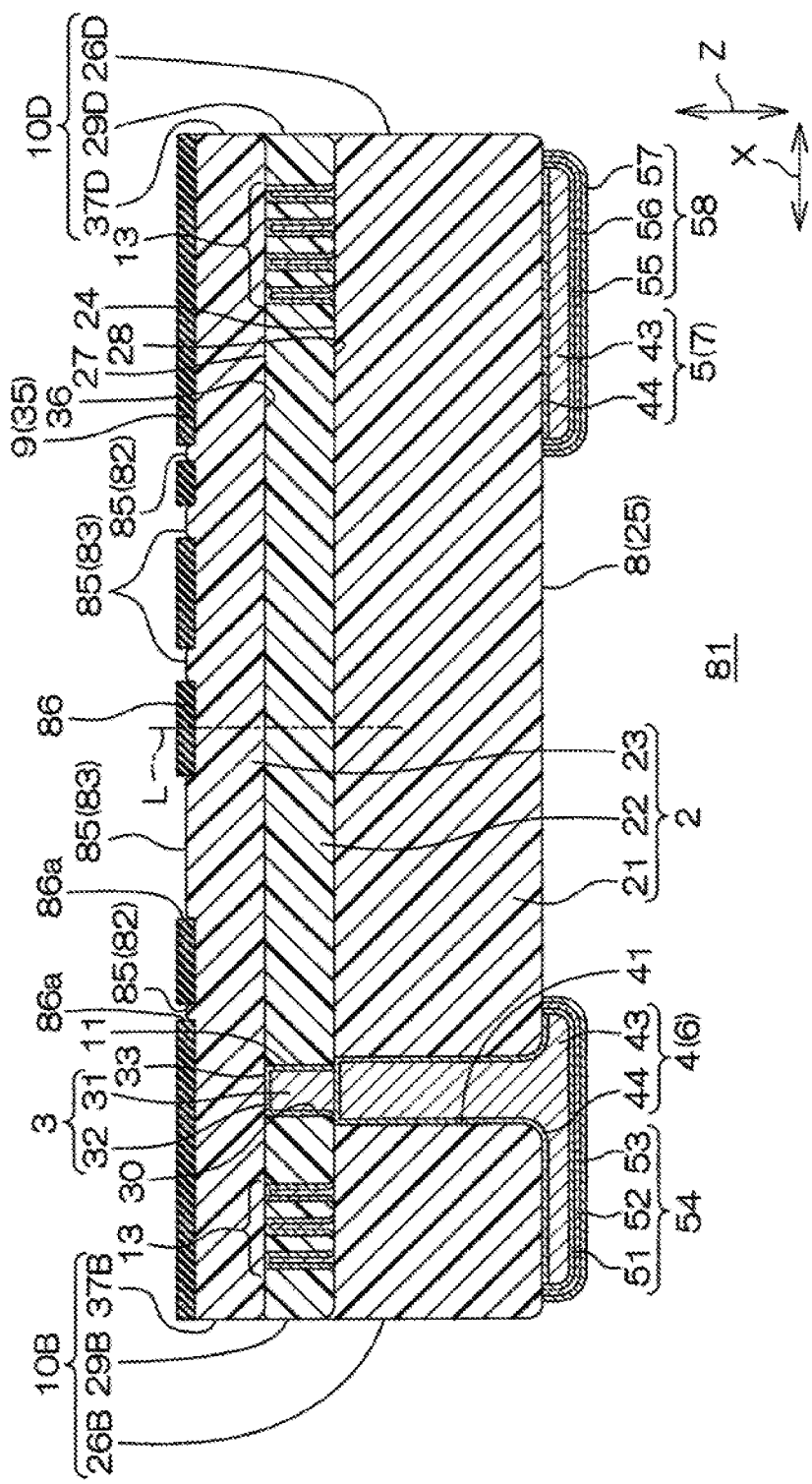
FIG. 12 is a sectional view for explaining a structure of a chip inductor according to a third embodiment of the present technology, the view corresponding to FIG. 8.

FIG. 12 is a view corresponding to FIG. 8 and is a sectional view for explaining a structure of a chip inductor 91 according to the third embodiment of the present technology. Hereinafter, with respect to the structures of the chip inductor 91 corresponding to the structures described for the chip inductor 81, the explanation is omitted by providing the same reference symbols as described for the chip inductor 81.

Referring to FIG. 12, the chip inductor 91 further covers the non-mounting face 9 of the sealing resin 2 and further includes the marking material layer 86 having the marking pattern groove 86a. In this configuration, the mark 82 includes the marking pattern groove 86a of the marking material layer 86 in addition to the protruding portion 85 of the non-mounting face 9. As a material for the marking material layer 86, any material can be applied.

The marking material layer 86 may be made of a material different from the sealing resin 2 (resin protective layer 23). The marking material layer 86 may contain a metal material, a semiconductor material, or an insulating material. In this configuration, the marking material layer 86 contains silicon oxide.

The protruding portion 85 and the marking pattern groove 86a change a reflection direction and a refraction direction of light incident on the non-mounting face 9 of the sealing resin 2. As a result, the marking pattern groove 86a (mark 82) is visually recognized. The chip inductor 91 having such a structure is manufactured by omitting the step of removing the marking pattern in Step S22 in FIG. 9 in the method for manufacturing the chip inductor 81 described hereinbefore.

As described hereinbefore, also for the chip inductor 91, effects similar to the effects described for the chip inductor 1 can be generated. Also, the chip inductor 91 allows the mark 82 to be formed on the non-mounting face 9 of the sealing resin 2. Thereby, various information can be obtained from the mark 82, and thus convenience of the miniaturized chip inductor 91 can be enhanced.

Figure 13:
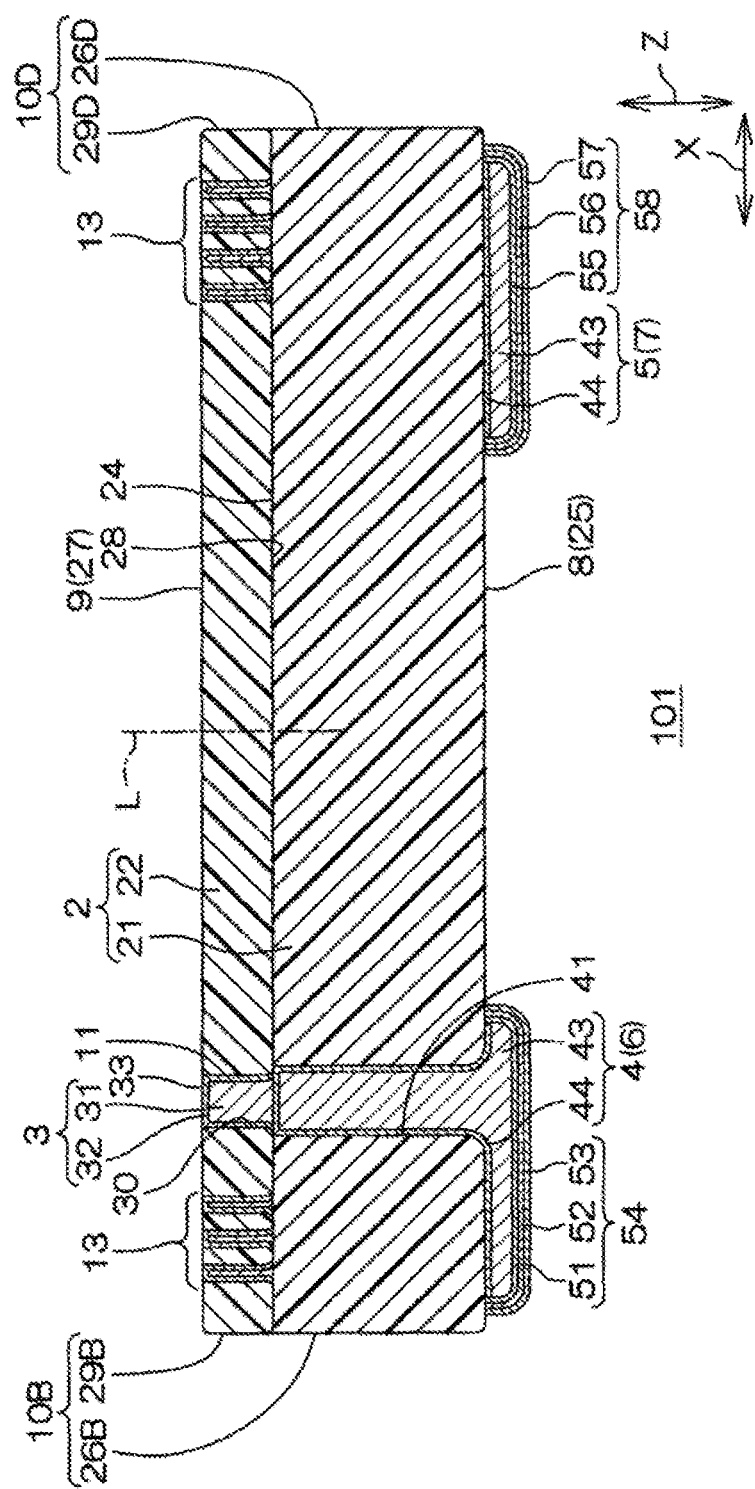
FIG. 13 is a sectional view for explaining a structure of a chip inductor according to a fourth embodiment of the present technology, the view corresponding to FIG. 3.

FIG. 13 is a view corresponding to FIG. 3 and is a sectional view for explaining a structure of a chip inductor 101 according to the fourth embodiment of the present technology. Hereinafter, with respect to the structures of the chip inductor 101 corresponding to the structures described for the chip inductor 1, the explanation is omitted by providing the same reference symbols as described for the chip inductor 1.

The chip inductor 101 is different in the structure from the chip inductor 1 from the viewpoint that the chip inductor 101 does not have the resin protective layer 23. In this configuration, the non-mounting face 9 of the sealing resin 2 is formed of the first face 27 of the resin wiring layer 22.

The chip inductor 101 having such a structure is manufactured by omitting the step of forming the resin protective layer 23 in Steps S2 and S3 in FIG. 5 in the method for manufacturing the chip inductor 1 described hereinbefore.

As described above, the chip inductor 101 may not provide the protective effect for the coil conductor 3 resulting from the resin protective layer 23, but can achieve effects similar to the effects described for the chip inductor 1. In addition, the chip inductor 101 allows the height reduction by the thickness of the excluded resin protective layer 23.

Although the embodiments of the present technology have been explained hereinbefore, the present technology can be further carried out in another embodiment.

In each embodiment described hereinbefore, the plurality of resin layers 21, 22, and 23 may be a positive type photosensitive resin. Needless to say, at least one of the plurality of resin layers 21, 22, and 23 may be a positive type photosensitive resin, and the other resin layers may be negative type photosensitive resins.

In each embodiment described hereinbefore, at least one of or all the Ni layer 51, the Pd layer 52, and the Au layer 53 may be excluded. In each embodiment described hereinbefore, at least one of or all the Ni layer 55, the Pd layer 56, and the Au layer 57 may be excluded.

In each embodiment described hereinbefore, the supporting resin layer 21 may have a thickness equal to or smaller than the thickness of the resin wiring layer 22. In each embodiment described hereinbefore, the supporting resin layer 21 may have a thickness equal to or smaller than the thickness of the resin protective layer 23. In each embodiment described hereinbefore, the supporting resin layer 21, the resin wiring layer 22, and the resin protective layer 23 may have the same thickness.

In the fourth embodiment described hereinbefore, the marking material layer 86 having the marking pattern groove 86a may be formed on the non-mounting face 9 of the sealing resin 2. Thereby, the coil conductor 3 can be protected by the relatively thin marking material layer 86, and at the same time, the mark 82 can be formed. Needless to say, the coil conductor 3 may be protected by the marking material layer 86 (in this case, a simple insulating layer) having no marking pattern groove 86a.

In each embodiment described hereinbefore, an example for producing an inductor (coil) as a passive element has been explained. However, instead of the inductor, a resistor may be produced. In the case of producing the resistor, any conductor (conductor corresponding to the coil conductor) may be wound into a band shape, a line shape, or a zigzag shape, instead of a spiral shape, in the sealing resin 2.

Furthermore, various design changes can be made within a scope of the matters described in Claims.

The present disclosure contains subject matter related to that disclosed in Japanese Priority Patent Application JP 2018-068114 filed in the Japan Patent Office on Mar. 30, 2018, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A chip inductor, comprising:
    a sealing resin having a mounting face, wherein
        the sealing resin has a resin laminated structure including a plurality of resin layers,
        the plurality of resin layers comprises a supporting resin layer, a resin wiring layer, and a resin protective layer, and
        the resin wiring layer is between the supporting resin layer and the resin protective layer;
    a coil conductor disposed in the sealing resin, wherein
        the coil conductor includes an inner end and an outer end,
        the coil conductor is a single continuous coil which is spirally wound on a first face of the supporting resin layer,
        the coil conductor has a laminated structure including a main electrode layer and a barrier electrode layer, and the barrier electrode layer is between the main electrode layer and the resin wiring layer,
        the resin wiring layer has a first face and a second face, the second face of the resin wiring layer is integrated with the first face of the supporting resin layer,
        the first face of the resin wiring layer is opposite to the second face of the resin wiring layer,
        the barrier electrode layer includes a covering portion which covers an end portion on a side of the first face of the resin wiring layer in the main electrode layer;
    an inner terminal disposed on the mounting face, and electrically connected to the inner end; and
    an outer terminal disposed on the mounting face, and electrically connected to the outer end, wherein
        the resin wiring layer has a coil trench which penetrates the resin wiring layer to embed the coil conductor in the resin wiring layer, and
        the supporting resin layer comprises an inner contact hole to expose the inner end of the coil conductor to the inner terminal, and an outer contact hole to expose the outer end of the coil conductor to the outer terminal.

2. The chip inductor according claim 1, further comprising:
    an inner contact electrode disposed in the sealing resin, and electrically connecting the inner end with the inner terminal; and
    an outer contact electrode disposed in the sealing resin, and electrically connecting the outer end with the outer terminal.

3. The chip inductor according to claim 1, wherein
    the inner terminal is opposite to the inner end of the coil conductor through a first part of the sealing resin interposed therebetween, and
    the outer terminal is opposite to the outer end of the coil conductor through a second part of the sealing resin interposed therebetween.

4. The chip inductor according to claim 1, wherein the coil conductor is wound around a winding axis line extending along a normal direction of the mounting face.

5. The chip inductor according to claim 1, wherein
    the sealing resin has a non-mounting face opposite to the mounting face, and
    a distance between the mounting face and the coil conductor is equal to or longer than a distance between the non-mounting face and the coil conductor.

6. The chip inductor according to claim 1, wherein the plurality of resin layers are laminated along a normal direction of the mounting face.

7. The chip inductor according to claim 6, wherein each of the plurality of resin layers has a flat face extending along the mounting face.

8. The chip inductor according to claim 1, wherein the sealing resin is formed in a shape of a rectangular parallelepiped chip.

9. The chip inductor according to claim 1, wherein the sealing resin includes a photosensitive resin.

10. A chip inductor, comprising:
    a resin layer having a first face on one side and a second face on an other side, the second face being a mounting face;
    a resin protective layer on the resin layer;
    a resin wiring layer between the resin layer and the resin protective layer;
    a coil conductor including an inner end and an outer end, wherein
        the coil conductor is a single continuous coil which is spirally wound on the first face of the resin layer,
        the coil conductor has a laminated structure including a main electrode layer and a barrier electrode layer, and the barrier electrode layer is between the main electrode layer and the resin wiring layer,
the resin wiring layer has a first face and a second face,
the second face of the resin wiring layer is integrated with the first face of the resin layer,
the first face of the resin wiring layer is opposite to the second face of the resin wiring layer,
the barrier electrode layer includes a covering portion which covers an end portion on a side of the first face of the resin wiring layer in the main electrode layer;
an inner terminal disposed on the second face of the resin layer, and electrically connected to the inner end; and
an outer terminal disposed on the second face of the resin layer, and electrically connected to the outer end, wherein
the resin wiring layer has a coil trench which penetrates the resin wiring layer to embed the coil conductor in the resin wiring layer, and
the resin layer comprises an inner contact hole to expose the inner end of the coil conductor to the inner terminal, and an outer contact hole to expose the outer end of the coil conductor to the outer terminal.

11. The chip inductor according to claim 10, further comprising:
an inner contact electrode penetrating the resin layer, and electrically connecting the inner end of the coil conductor with the inner terminal; and
an outer contact electrode penetrating the resin layer, and electrically connecting the outer end of the coil conductor with the outer terminal.

12. The chip inductor according to claim 10, wherein
the inner terminal is opposite to the inner end of the coil conductor through the resin layer interposed therebetween, and
the outer terminal is opposite to the outer end of the coil conductor through the resin layer interposed therebetween.

13. The chip inductor according to claim 10, wherein the resin protective layer covers the coil conductor.

14. The chip inductor according to claim 10, wherein the resin layer includes a photosensitive resin.

15. A chip inductor, comprising:
a sealing resin having a mounting face and made of a photosensitive resin, wherein
the sealing resin has a resin laminated structure including a plurality of resin layers,
the plurality of resin layers comprises a supporting resin layer, a resin wiring layer, and a resin protective layer, and
the resin wiring layer is between the supporting resin layer and the resin protective layer;
a coil conductor sealed with the sealing resin so as to be in contact with the sealing resin, wherein
the coil conductor includes an inner end and an outer end,
the coil conductor is a single continuous coil which is spirally wound on a first face of the supporting resin layer,
the coil conductor has a laminated structure including a main electrode layer and a barrier electrode layer, and
the barrier electrode layer is between the main electrode layer and the resin wiring layer,
the resin wiring layer has a first face and a second face,
the second face of the resin wiring layer is integrated with the first face of the supporting resin layer,
the first face of the resin wiring layer is opposite to the second face of the resin wiring layer,
the barrier electrode layer includes a covering portion which covers an end portion on a side of the first face of the resin wiring layer in the main electrode layer;
an inner terminal disposed on the mounting face, and electrically connected to the inner end; and
an outer terminal disposed on the mounting face, and electrically connected to the outer end, wherein
the resin wiring layer has a coil trench which penetrates the resin wiring layer to embed the coil conductor in the resin wiring layer, and
the supporting resin layer comprises an inner contact hole to expose the inner end of the coil conductor to the inner terminal, and an outer contact hole to expose the outer end of the coil conductor to the outer terminal.

16. The chip inductor according to claim 15, further comprising:
an inner contact electrode sealed with the sealing resin so as to be in contact with the sealing resin, and electrically connecting the inner end with the inner terminal; and
an outer contact electrode sealed with the sealing resin so as to be in contact with the sealing resin, and electrically connecting the outer end with the outer terminal.

17. The chip inductor according to claim 15, wherein the plurality of resin layers are laminated along a normal direction of the mounting face.

18. The chip inductor according to claim 15, wherein
the supporting resin layer includes a first face on one side and a second face on other side,
the second face of the supporting resin layer is the mounting face,
the resin protective layer is laminated on the supporting resin layer,
the resin protective layer protects the supporting resin layer and the resin wiring layer,
the coil conductor is on the first face of the supporting resin layer so as to be interposed between the supporting resin layer and the resin protective layer,
the inner terminal is disposed on the second face of the supporting resin layer, and
the outer terminal is disposed on the second face of the supporting resin layer.

19. The chip inductor according to claim 15, wherein
the supporting resin layer includes a first face on one side and a second face on other side,
the second face of the supporting resin layer is the mounting face,
the resin wiring layer is laminated on the supporting resin layer,
the resin protective layer is laminated on the resin wiring layer,
the resin protective layer protects the resin wiring layer,
the coil conductor is embedded in the resin wiring layer on the first face of the supporting resin layer,
the inner terminal is disposed on the second face of the supporting resin layer, and
the outer terminal is disposed on the second face of the supporting resin layer.

* * * * *